(12) United States Patent
Thuss

(10) Patent No.: US 11,473,200 B2
(45) Date of Patent: Oct. 18, 2022

(54) FINE AND MICRO FEATURE COLD SPRAY DEPOSITION OF SEMICONDUCTORS, MAGNETIC AND OTHER BRITTLE FUNCTIONAL MATERIALS

(71) Applicant: Richard C Thuss, Berryville, VA (US)

(72) Inventor: Richard C Thuss, Berryville, VA (US)

( * ) Notice: Subject to any disclaimer, the term of this patent is extended or adjusted under 35 U.S.C. 154(b) by 66 days.

(21) Appl. No.: 17/092,305

(22) Filed: Nov. 8, 2020

(65) Prior Publication Data

US 2022/0049360 A1 Feb. 17, 2022

Related U.S. Application Data

(60) Provisional application No. 63/064,972, filed on Aug. 13, 2020, provisional application No. 63/093,744, filed on Oct. 19, 2020.

(51) Int. Cl.

| | |
|---|---|
| *C23C 24/04* | (2006.01) |
| *H01L 35/34* | (2006.01) |
| *H01F 41/16* | (2006.01) |
| *H01L 41/314* | (2013.01) |
| *H01L 35/16* | (2006.01) |

(52) U.S. Cl.
CPC .............. *C23C 24/04* (2013.01); *H01F 41/16* (2013.01); *H01L 35/34* (2013.01); *H01L 41/314* (2013.01); *H01L 35/16* (2013.01)

(58) Field of Classification Search
CPC .......... C23C 24/04; H01F 41/16; H01L 35/16
See application file for complete search history.

(56) References Cited

U.S. PATENT DOCUMENTS

| 8,187,620 B2 | 5/2012 | Chandrasekarian |
| 2003/0209286 A1 | 11/2003 | Leonardi |
| 2007/0221746 A1 | 9/2007 | Heinrich |

(Continued)

OTHER PUBLICATIONS

Kim et al., "Fabrication of WC-Co coatings by cold spray deposition", Surface & Coatings Technology 191 (2005) 335-340. (Year: 2005).*

(Continued)

*Primary Examiner* — Tae-Sik Kang
(74) *Attorney, Agent, or Firm* — Lytle Patent Services, LLC

(57) ABSTRACT

An apparatus and methods to make a product using supersonic cold-spray deposition of brittle functional materials in fine and micro features down to 10 μm in minimum dimension. The process may use semiconductors such as bismuth and antimony telluride formulations, and hard magnetic materials such as neodymium iron boride and strontium ferrite, and soft magnetic materials such as manganese zinc ferrite, and manganese ferrite materials. In addition, the methods and processes have been demonstrated for materials as soft as graphite and as hard as boron carbide. Micro components have been deposited in square, tapered and elongated shaped features with feature sizes as small as 10 μm in minimum dimensions and applied to flat and highly complex shaped surfaces. This process when combined with other cold spray manufacturing processes allows the total additive manufacturing of complete electronic, magnetic and other complex devices including multiple type of brittle functional materials.

22 Claims, 14 Drawing Sheets

(56) References Cited

U.S. PATENT DOCUMENTS

2012/0180783 A1 7/2012 Kruger
2014/0272171 A1 9/2014 Vogli
2019/0224701 A1 7/2019 Burgess

OTHER PUBLICATIONS

Hyung-jun et al "Fabrication of WC-Co coatings by cold spray deposition" Surface and Coating Technology, 191, (2005) pp. 335-340. (Year: 2005).

* cited by examiner

FINE AND MICRO FEATURE COLD SPRAY DEPOSITION OF SEMICONDUCTORS, MAGNETIC AND OTHER BRITTLE FUNCTIONAL MATERIALS

CROSS REFERENCE TO RELATED PATENT APPLICATIONS

This present application contains subject matter related to U.S. application Ser. No. 16/894,098 filed on 5 Jun. 2020, which is a continuation of U.S. application Ser. No. 16/399,560 filed 30 Apr. 2019, the entire contents of both of which being incorporated by reference herein in their entirety. This present application also contains subject matter related to subject matter disclosed in U.S. Pat. Nos. 10,714,671, and 9,306,146, the entire contents of each of which being incorporated by reference herein in their entirety. The present application also claims the benefit of the earlier filing dates of U.S. provisional Application No. 63/064,972 filed on 13 Aug. 2020, and U.S. Provisional Application No. 63/093,744 filed on 19 Oct. 2020, the entire contents of both which being incorporated by reference herein in their entirety.

BACKGROUND

"Supersonic cold spray" is a material deposition process that has been developed to build up metallic material layers by impacting micrometer sized metal particles at high velocities onto a substrate. A helium, nitrogen or other gas stream under pressure is accelerated to supersonic velocity by expansion through a de Laval type converging-diverging nozzle. The normally spherical metal particles of the material being deposited are inserted into the gas stream either in the converging or diverging sections of the nozzle and then accelerated to high velocity. The metal particles in the size range from 5-80 micrometers become entrained within the gas and are directed towards the surface where they deform and knit together on impact forming a strong bond with the surface and with each other without melting. Gas type, gas pressure, gas temperature, nozzle configuration, nozzle extension length, average particle size of the material being sprayed, the particle's drag coefficient, and the particle size distribution must be optimized for each different material. In addition, the feed mechanism and the feed rate of the powdered material into the gas stream must be tailored to the material being sprayed. A unique advantage of the cold-spray process is that the particles are maintained below their melt temperature, and successful deposition depends on the metal particles deforming on impact.

Implementation of the cold spray process has been primarily focused on the use of metallic materials, materials that are malleable and that can be hammered or pressed permanently out of shape without breaking or cracking and particles that can be fused or forged together below their melt temperature. For that reason, the cold-spray process has not been generally applied to the deposition of brittle materials, including non-ductile crystalline, polycrystalline, and glassy materials, such as semiconductors, magnetic and many other brittle functional materials.

Recent advances by the present inventor in supersonic cold spray deposition technology, however, have resulted in the ability to use this additive manufacturing technique for the deposition of both thick and thin layers of brittle functional materials on a wide range of substrate materials without the need for the addition of ductile materials in the cold spray powder mix. These advances enable brittle-to-brittle material adhesion of the powder material to itself and/or a substrate, and allow the deposition of brittle materials in a thickness range from microns to centimeters. This development has opened up cold spray technology to include a wide range of functional material classes beyond just structural materials, including electronic materials, energy technology and environmental materials, magnetic materials, and optical materials. Brittle materials that can now be cold sprayed include crystalline, polycrystalline and glassy materials such as energy harvesting semiconductors, hard and soft magnetic materials optical materials, graphite, brittle wear resistant coating materials, energy storage anode and cathode materials, and glassy thermal and electrical isolation materials.

The supersonic cold spray process when used for both metals and brittle materials is generally a broad featured deposition process with the minimum feature size primarily determined by the exit area of the nozzle assembly and also by the internal shape of the de Laval nozzle. This minimum feature size is therefore determined by the throat diameter and gas expansion ratio of the equipment being used and is generally in the range of 5-6 mm in diameter or 20-30 square millimeters in area. The minimum thickness of a deposited layer of material is also a function of the particle size of the material being deposited. Elongated shape and more complex shaped deposition features can be obtained by contour shaping the expansions region and/or the exit tube of the nozzle assembly, but the nozzle throat area to exit area expansion ratio needs to remain near constant to avoid significant reduction in the particle impact velocity.

For many types of brittle materials such as semiconductors, magnetic materials, optical materials, and some electronic materials there are numerous applications where the desired feature sizes are much smaller than the exit area of a typical cold spray system. While some reduction to that minimum feature size can be realized by reducing the throat diameter, and or the expansion ratio, and post cold spray machining of the deposited material can also be used, these approaches are extremely difficult to implement when the feature size desired is less than a few millimeters square in area, and impractical with feature dimensions of several hundred microns or less.

The size of the particles that are required for the cold spray deposition of brittle functional materials is generally much smaller than the normally spherical particles used in the cold spray deposition of metals. Particle sizes used for metal cold spray deposition are generally in the particle size range from 5-80 microns, and most often bounded by the middle of that range. Metal particles used for the cold spray process are also generally spherical in shape. The cold spray process for brittle materials requires particles that on the average are much smaller, and that are bound within a size range from 0.2 $\mu m$ to 10 $\mu m$ with the volumetric D(50) average particle size normally centered around 2-3 $\mu m$, and particles that are non-uniform in shape in all three dimensions.

The much smaller average particle size, the non-uniformity in shape, together with a proportion of the particles in the cold spray powder being up to an order of magnitude smaller than the average offers the potential for the cold spray deposition of micro-thin layers and micro-area features of brittle functional materials whose minimum dimensions are in the range of 20 $\mu m$ or less using controlled powder feed rates, and suitable masking processes, such as polymer films, metals screens, and various types of positive and negative photo-resists currently in use in existing semiconductor processing. In addition, patterns of micron sized depressions or cavities can be etched into a surface and filled with cold sprayed brittle functional materials and the surface then machined leaving only the micron sized pattern of material.

The ability to cold spray brittle functional materials, such as semiconductors, magnetic materials, optical materials and electronic materials in fine and micro-features, when combined with the existing state of the art of using cold spray technology to deposit metallic materials greatly expands the application space for cold spray technology. The combination of these synergistic technologies offers the potential for the complete additive manufacturing of complex components and functional devices which incorporate both metallic conductors and brittle semiconductors or other brittle functional materials. One particular example is the ability to completely additively manufacture various energy harvesting systems including thermoelectric generators. In many of those applications, besides the brittle semiconductors and conductive metallic materials, both thermal and electrical insulators are often required. The ability to cold spray brittle crystalline and glassy materials, therefore, opens up the potential for the direct cold spray deposition of thin layers of graphite materials for electrical and thermal conduction applications, and thin and thick layers of glassy and other ceramic materials for electrical isolation, and also the potential for the deposition of low density glassy and ceramic materials with low thermal conductivity applications. In addition, deposition of very thin micro-spots of optical brittle functional materials covering part of a surface can be used to produce spectrally selective surfaces.

SUMMARY OF THE DISCLOSURE

Using a supersonic cold-spray process, brittle functional materials such as semiconductors, magnetic materials, optical materials, and electronic materials can be deposited with feature sizes as small as ten microns to make micro components. The adhesion to the surface and brittle particle adhesion to each other, and the deposition of near theoretical density layers of brittle crystalline, polycrystalline and glassy material particles in very fine feature sizes down to less than 20 μm has been achieved by controlling the shapes of the particles in the powder material, limiting the maximum particle size, controlling the particle size distribution, utilizing specifically configured cold spray nozzle and pre-heated pressurized gas process, controlling the peak particle velocities, combined with selective masking of the deposition surface using high temperature polymer films, metal foils and screens, photo resists, and other established masking technologies. Powder materials, equipment design, process parameters and masking methods have been developed to enable and enhance the cold-spray deposition of brittle functional material layers onto metals, glass, ceramic, and high temperature capable polymer surfaces with thicknesses in the range of 20-40 μm and features smaller than 225 square μm in area and minimum feature dimensions approaching 10 μm. The powder used in the supersonic cold spray process for brittle semiconductor, brittle magnetic materials and brittle electronic materials is controlled to volumetrically have greater than 90% of the particles with a maximum particle size not greater than 10 micrometers and controlled volumetric particle size distribution over each of the nominal particle size ranges, from 0.10-2.0 micrometers; 2.0-5.0 micrometers; and 5.0-10 micrometers in major dimension, with D(50) volumetric particle sizes centered in the 2-3 micrometer size range when combined with 0.5-1.5 mm diameter cold spray nozzle throat dimensions, a nozzle throat area to exit area expansion ratios of 6-10, a nozzle divergent/convergent length ratios between 3-10, a nitrogen or helium gas process parameters of 250-650 degrees centigrade pre-heat, and gas pressures from 0.3-1.5 million pascal (MPa), an adhesion to the surface and deposition of near theoretical density layers of brittle functional materials including semiconductors, magnetic materials, optical materials, electronic materials, and other poly crystalline and glassy particles has been achieved with continuous layer thicknesses down to 20 μm, and individual feature sizes from 2 mm down to 10 μm. Using this process, the fine features are deposited onto flat as well as complex shaped surfaces, and from individual, small sized round or square spots to very high aspect ratio line depositions, thus enabling fine feature brittle functional material deposition specifically tailored to the application. Fine feature supersonic cold-spray deposition of semiconductor materials such as bismuth telluride, antimony telluride and tetrahedrite materials have been demonstrated, as have Neodymium Iron Boride, and Strontium ferrite based permanent magnets, Manganese and Manganese/Zinc type soft magnetic materials, barium titanate piezoelectric materials, graphite, and boron carbide. These processes apply to brittle functional materials used in numerous other magnetic material, electronic material, optical materials, and energy material applications. Unique powder material composition, particle shapes and sizes, and control of the cold-spray process parameters and equipment design as well as the selected masking technique allow the uniform cold spray deposition of very fine and micro feature sizes and micrometer material thickness, and the developed process further enables and enhances the cold spray deposition of brittle functional materials and other non-malleable particles of irregular shapes and dimensions of less than 20 micrometers, as well as the deposition of hollow glass microspheres in the size range from 5-37 microns. The required particle size, masking methods, and equipment design can also be utilized to deposit fine features of ductile materials, such as but not limited to aluminum.

BRIEF DESCRIPTION OF THE DRAWINGS

FIG. 6 shows an example of a typical commercial cold spray nozzle for use in a low pressure cold spray system for the deposition of metallic materials.

DETAILED DESCRIPTION

The supersonic cold spray process has been focused on the deposition of metallic materials primarily for structural, wear resistance and cosmetic repair applications for more than 30 years, and more recently its application areas have been expanded to include the deposition of a range of brittle materials including semiconductors, magnetic materials, and other types of brittle functional materials. The process for the cold spray of brittle functional materials can be used for a very broad range of material compositions. Successful thin layer and fine feature testing has been performed using brittle functional materials over a range of MOH's hardness from 2.0 to 9.5 indicating that the physical aspects of the particles, both in shape and particle size distribution, are more important than material composition and other properties. The deposition process has been theorized to be primarily a mechanical interlocking process with the impact energy of the micron and nanometer sized particles densifying the deposited material and producing near theoretically dense material depositions. This enables the use of a wide variety of brittle functional materials that cover a variety of applications including semiconductor based thermoelectric generators and coolers, complex shaped and thin form soft and hard magnetic materials for electric motors, RF devices, RF shielding and other magnetic coating applications, other electronic and energy harvesting commercial applications including piezoelectric materials tailored optical property coatings, anode and cathode materials for battery applications and many other inorganic compounds. Optimization of the final deposited material and the shape of the deposited material is achieved by the selection of numerous powder material, equipment design, and supersonic cold-spray process parameters.

Applications for the cold spray of brittle functional materials can now be expanded to include the ability to cold spray both full coverage and partial coverage micro thin layers down to less than 20 μm in thickness of material over large areas, and the deposition of fine and micro features from 2 mm down to 10 microns in minimum dimension using shaped nozzles and/or masking technologies as well as surface micro-etching processes. The range of materials that can be cold sprayed can now be expanded to include the deposition of a wider range of brittle functional materials including electrically conducting graphite and other non-metallic conducting materials as well as low density, low thermal conductivity and electrically insulating glass materials using powders containing thin shelled hollow microspheres.

Figure 1:
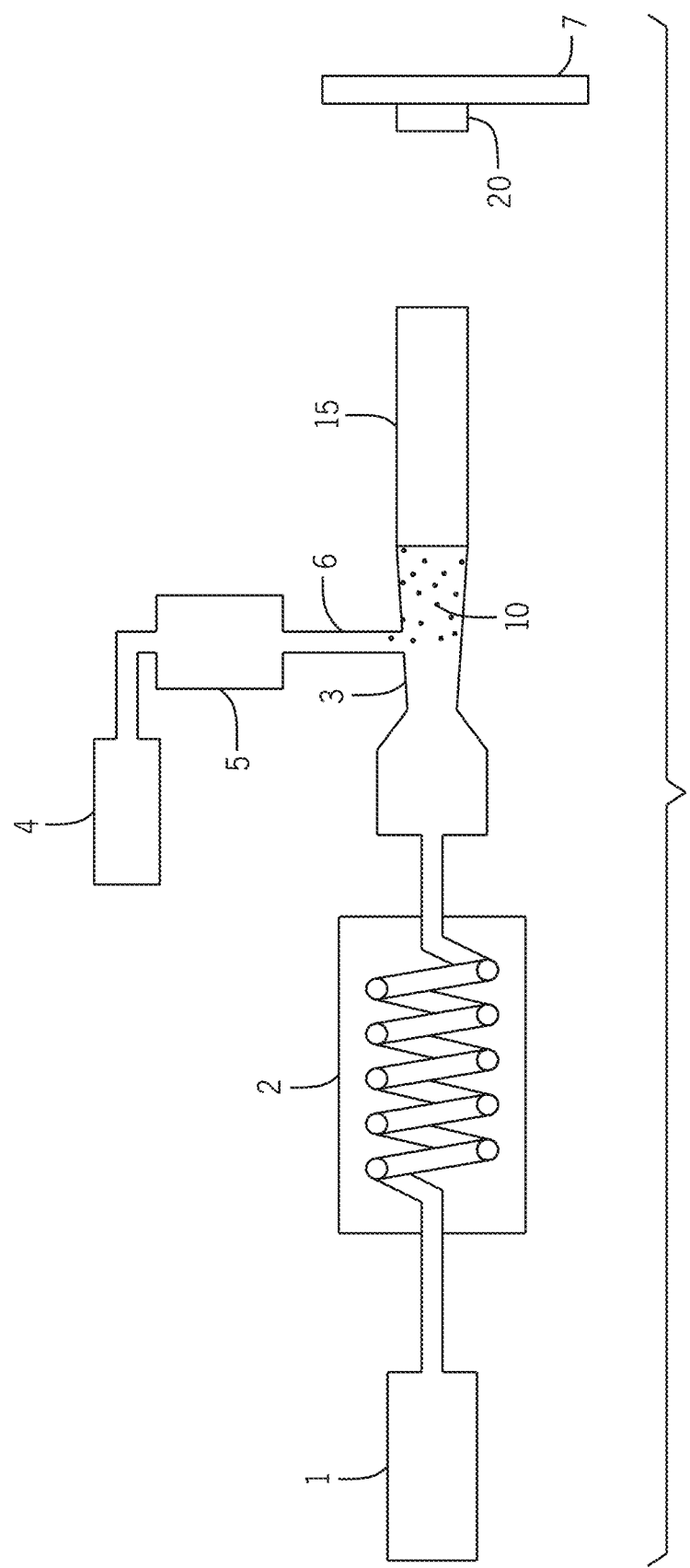
FIG. 1 is a diagram of one type apparatus used for the cold spray deposition of brittle functional materials.
Figure 4:
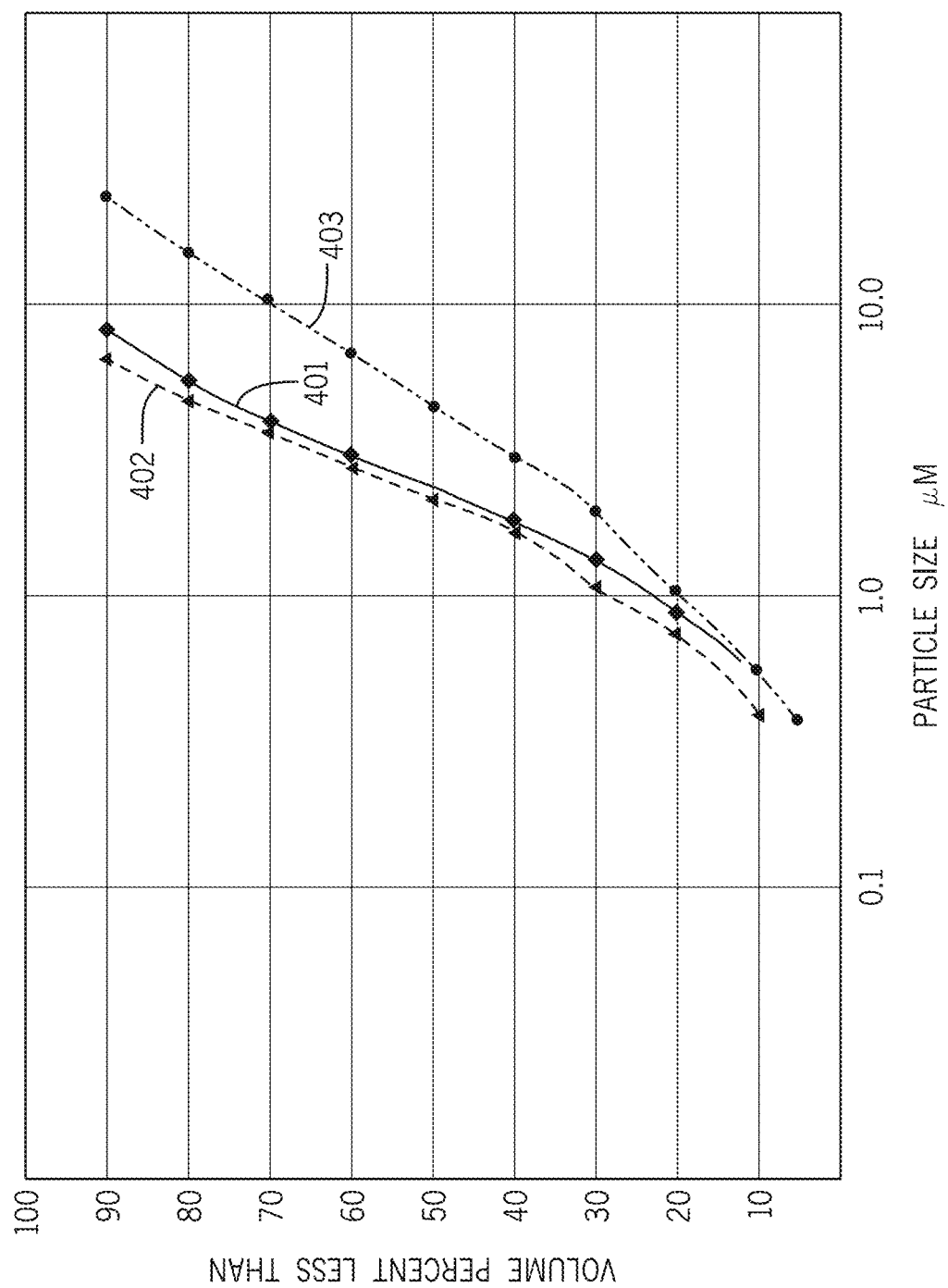
FIG. 4 is a graph of a volumetric particle size distribution of N-type bismuth telluride semiconductor and Neodymium Iron Boride particles that can be successfully cold-sprayed with minimum feature sizes in the range of 20 μm compared to fine and micro features with areas as small as 200 square μm and individual feature sizes down to 10 μm, and the volumetric particle size distribution of boron carbide that can be deposited as a partial area or complete area micro-thin coating using the processes and equipment design parameters defined within this disclosure.

FIG. 1 is a high-level diagram of one type of equipment that can be used for the cold spray deposition of fine and micro features of many types of brittle materials to form micro components. While both high pressure cold spray systems where the functional material powder is injected under pressure before the nozzle throat, or low pressure cold spray systems where the functional material powder is injected into the gas stream after the throat in the diverging section of the nozzle can be used. The use of a low pressure system shown in FIG. 1 has several advantages for cold spraying brittle functional materials, including but not limited to: 1) brittle functional material powders in the particle size range shown in FIG. 4 are usually very cohesive and resistant to flow under pressure, 2) the functional material is not subjected to the peak gas temperature and therefore more likely to retain its desired functional properties, and 3) less nozzle clogging will occur when using small throat diameters in the 0.5-1.5 mm range. Using the low pressure cold spray system shown in FIG. 1, a gas 1 such as, air, nitrogen or helium is pressurized in the range of from 0.3-1.7 MPa. This pressurized gas 1 is directed into a heater 2 and is heated to 100-650 degrees centigrade. This gas is then directed through a converging-diverging nozzle 3 with a throat diameter between 0.5 millimeter and 1.5 millimeter where the gas 1 is accelerated to supersonic velocity. In this version of a cold spray system, a low-pressure gas 4 such as air, nitrogen or argon at atmospheric pressure is drawn into a powder feeder 5. The powder feeder 5 contains complex shaped particles 10 in a particle size range from 0.2-10 micrometers in diameter. The low-pressure gas 4 combines with the particles 10 and carries them through a powder entrance tube 6 inserted into the diverging section of the converging-diverging nozzle 3 where it mixes into the gas 1 that has been accelerated to supersonic velocity. The irregular shaped brittle material particles 10 accelerated within the supersonic gas flow are directed via 15 a nozzle extension toward a substrate 7 where they are deposited as a coating 20 on impact.

Figure 2:
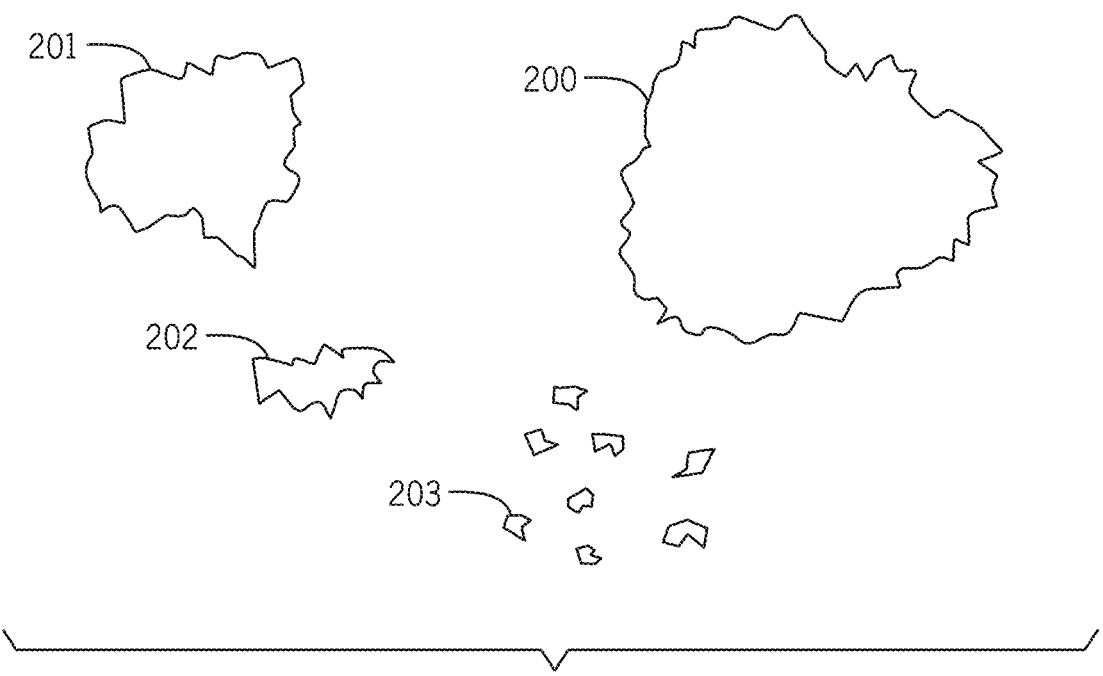
FIG. 2 is a diagram that shows a comparison of the complex and irregular particle shapes and sizes of brittle functional materials that can be deposited as fine and micro features (also referred to herein as micro components) using the supersonic cold spray process.
Figure 7:
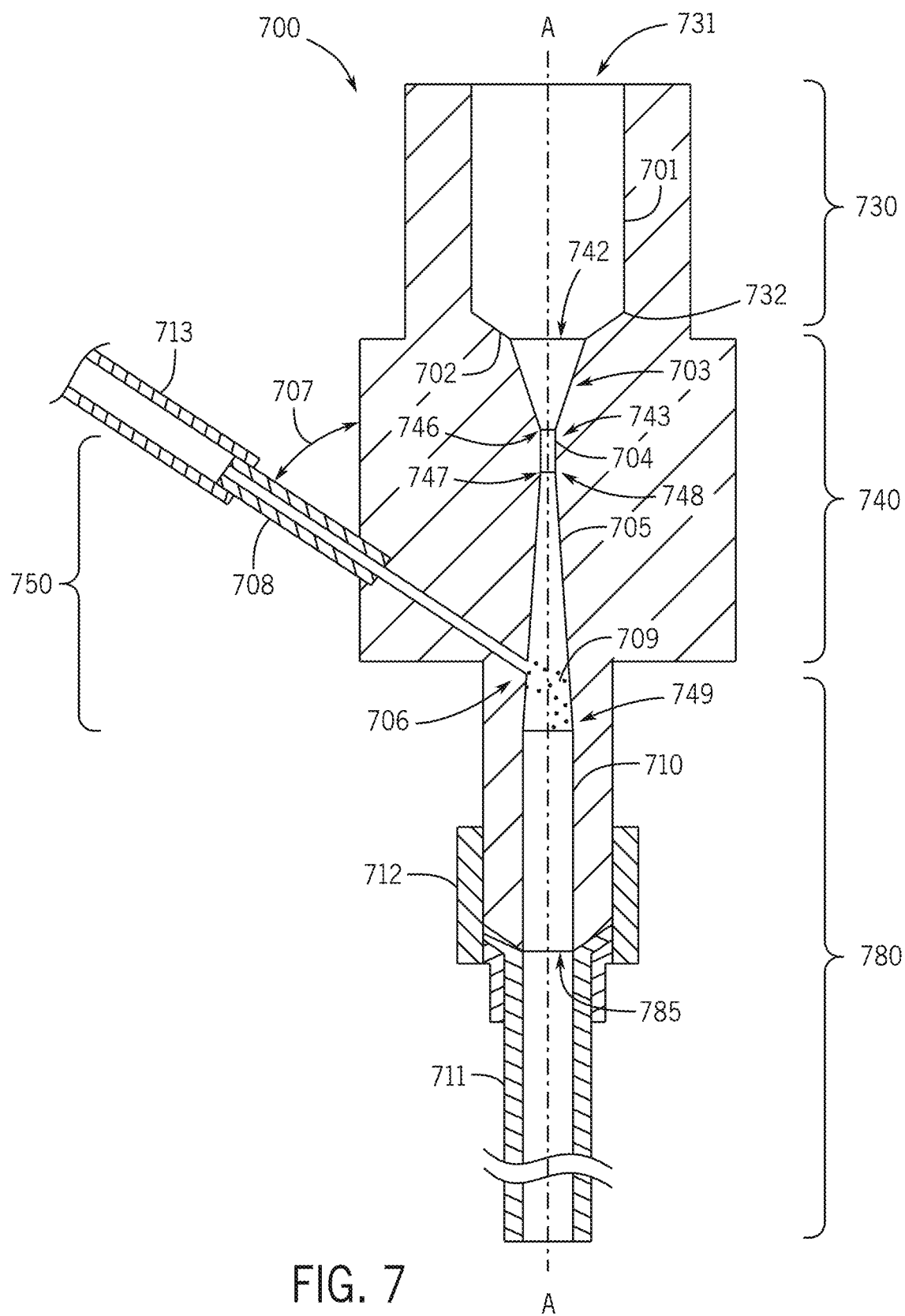
FIG. 7 is a diagram of a supersonic cold spray nozzle design that can be successfully used for the fine feature cold-spray deposition of brittle functional materials such as magnetic materials, thermoelectric semiconductors and other polycrystalline materials as described in the current disclosure.

FIG. 2 shows the shape and range of sizes for typical brittle material particles that can be accelerated to supersonic velocity and deposited in feature sizes as small as 10 μm by the cold spray system shown in FIG. 1 using the nozzle configuration as shown in FIG. 7, and masks (as will be discussed). Brittle functional material particles used in the cold spray process are normally irregular in shape and different in size in all three dimensions. The largest brittle functional material particles 200, are approximately 10 micrometers in major dimension, and the brittle functional material powder is composed of controlled percentages of 201 particles in the 5 μm size range, 202, particles whose maximum dimension is 2 μm and 203, particles less than 1.0 μm in maximum dimension. All of these particles vary in size in all three dimensions and with non-uniform surfaces and edges. Since the cold spray deposition process for brittle functional materials is believed to depend on the mechanical interlocking of particles, powders composed of spherical or near spherically shaped brittle functional material particles in many functional material classes that are in the size range distribution defined above will not deposit and build to thick layers of near theoretical density material. The behavior of brittle functional materials with a particle size less than 2 μm and more specifically less that 500 nm when they impact a surface at supersonic velocity, however, is not fully understood. Optical microscopic analysis of the very beginning process of cold spray particle deposition for some functional materials, such as but not limited to optical materials, ferrite magnetic materials, and piezoelectric materials, however, show that spherically shaped or near spherically shaped particles in the 2 μm diameter size range, and spherically shaped or near spherically shaped particles less than 500 nm in diameter can agglomerate into very small deposits that will cover part or virtually all of a surface in a layer just one to several particles in thickness. Partial depositions on some substrate materials form very small spherical shaped craters filled with the brittle functional material, and those depositions can produce spectrally selective surfaces which have many applications.

Figure 3:
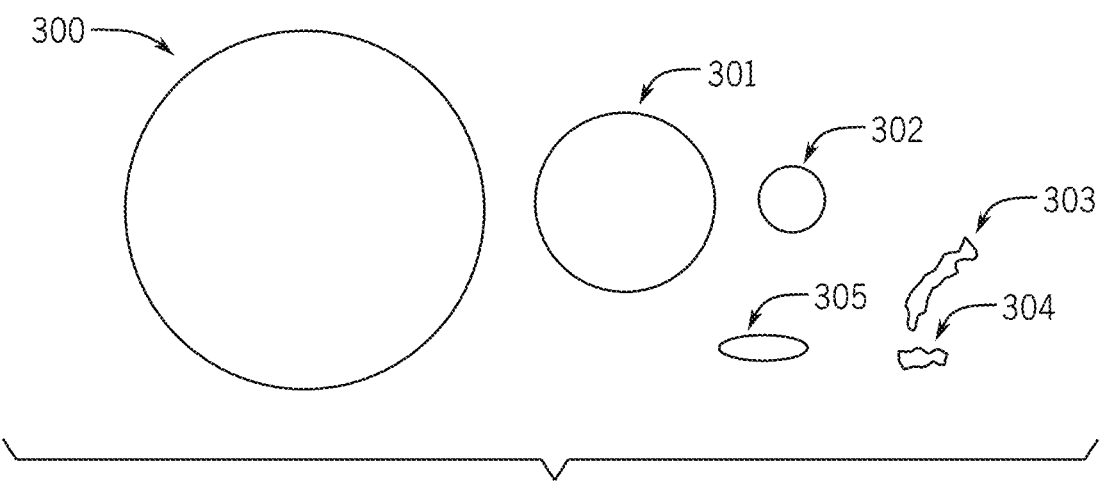
FIG. 3 is a diagram that shows an exemplary range of hollow glass microsphere particles, and borosilicate glass particles, which can be used to cold spray deposit a thermal and electrical isolation material.

FIG. 3 shows the range in sizes of hollow glass microspheres that can be deposited using the supersonic cold spray process to form a low density, thermal and electrical isolation material. The resulting cold sprayed thermal and electrical isolation material can be used in the cold spray additive manufacturing of complex devices which incorporate semiconductor, magnetic and/or other brittle functional materials. 300 shows a thin walled hollow microsphere with a maximum diameter of 37 μm, 301 a thin walled hollow glass microsphere with a nominal diameter of 15 μm, and 302, a hollow glass microsphere with a nominal diameter of 5 μm. These hollow glass spheres vary in true density from 0.1 to 0.6 gr./cc. and vary in crush strength from 1.7-193 mPa. Depending on the cold spray processing conditions, a portion of these hollow spheres will fracture into small, high aspect ratio shards of material 303, and 304 upon impact with the surface, a second portion of these very thin walled particles will deform 305 into more elongated hollow shapes due to temperature rise at impact and a third portion will remain intact. The combination of spherical, elongated and small fractured shards of glass material will then knit together into a low density, low thermal conductivity and low electrical conductivity material during the cold spray process with the final density and thermal conductivity determined by the hollow glass particle mixture selected.

FIG. 4 shows the volume percent less than particle size of three different brittle materials that can be successfully cold sprayed deposited as fine and micro features of micro components using nozzle configurations and masking processes as defined herein. Particle sizes were measured using a Mastersizer Laser diffraction system. 401 shows the particle size distribution of an N-type bismuth telluride semiconductor material and 402 shows the particle size range and distribution for a Neodymium Iron Boride magnetic material which can be used for fine and micro feature (i.e., portions of micro components or entire discrete micro components) cold spray deposition. The cold spray deposition of brittle materials has been found to depend on a range in the size of irregularly shaped particles within the powder which vary from several hundred nanometers to less than 10 μm. Particles which are larger than 10 μm in maximum dimension can act to disrupt the deposition process. Both the complex shape and the size distribution of the particles within the cold spray powder mix is what differentiates the cold spray of brittle materials from the cold spray processes used for metallic materials. The 401 particle size distribution of an N-type bismuth telluride semiconductor material and the 402 particle size range and distribution for a Neodymium Iron Boride magnetic material have been shown to apply to a wide range of functional material types, from extremely hard materials, such as boron carbide and Ferrite based magnetic materials, to moderate hardness materials, such as Neodymium Iron Boride magnetic material, and Tetrahedrite thermoelectric material formulations, to low hardness brittle functional materials such as bismuth and antimony telluride thermoelectric semiconductors. 403 shows a particle size distribution of a boron carbide powder measured using the Mastersizer system referenced above. Testing with boron carbide, multiple bismuth telluride based semiconductors as well as several composition of both hard and soft magnetic materials has shown that irregularly shaped particles in powders composed of particles within this 403 size range will not deposit into thick layers of material. The higher percentage of larger particles in the mix act to disrupt the particle to particle adhesion process. Brittle functional material powders with 403 particle size distributions can be deposited on a surface as a series of non-continuous microspots, and this micro-thin partial area coating can be used to change the surface spectral response. Brittle functional materials with particle size distributions intermediate between 402 and 403 but with the D(90) value not exceeding 15 μm may be usable for some fine and microfeature applications.

Particles of brittle, functional materials in the size and size distribution range shown in FIG. 4 can be produced using a number of techniques including melt spinning, and mechanical size reduction processes including jet milling and high energy planetary ball milling. The High Energy Ball milling process developed by the inventor and incorporated herein by reference can be used to create irregularly shaped brittle functional particle material powders that can be cold sprayed deposited into features down to approximately 10 µm in the smallest dimension.

Figure 5:
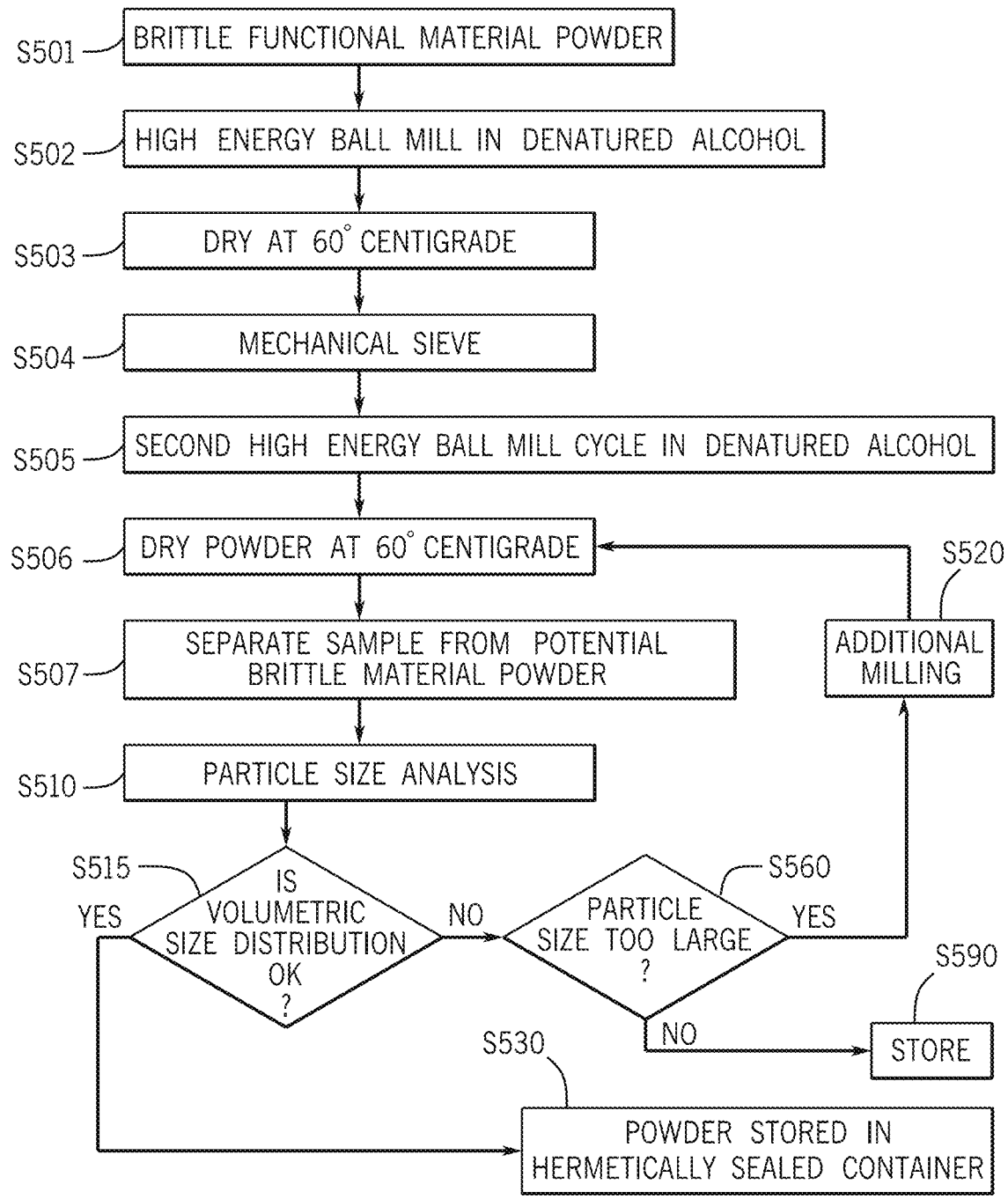
FIG. 5 is an example high energy ball milling process which can be used to prepare brittle material particles of the correct particle size distribution for fine and micro feature cold spray deposition.

FIG. 5 is a flowchart of one type of high energy ball milling process used to produce a brittle functional material powder 401 and 402 that can be successfully deposited into fine features (micro components) using the supersonic cold-spray process. Many commercially available brittle functional material powders used for other than cold spray applications normally have average and maximum particle size that are much larger than shown in FIGS. 4, 401, 402 and 403, and therefore must be reduced in particle size for cold spray deposition. The process begins at Step 501 where brittle functional materials in powder form are introduced into the high energy ball milling process. The brittle functional materials in powder form not limited to but including thermoelectric semiconductor material such as bismuth telluride, antimony telluride or Tetrahedrite type formulations, and hard magnetic materials such as Neodymium Iron Boride and soft magnetic materials such as Manganese Zinc type formulations are procured or manufactured. Then the process proceeds to Step 502 where the brittle functional material powder from Step 501 is then high energy mechanically ball milled. Successful high energy mechanical ball milling in Step 502 includes but is not limited to ball milling the Step 501 material in 100 milliliter (ml) alumina vessels using an Across International Planetary Ball Mill. Fifteen 10 mm diameter and thirty, 6 mm diameter alumina balls are added together with 50 grams of brittle functional materials fabricated or procured per Step 501. Ten ml of denatured alcohol is then added to the alumina vessel before sealing and then planetary ball milling the mixture at 600 RPM for a total of three to six hours and reversing the direction of the mill every thirty minutes during that three-hour period. The required time milling time is determined by the hardness of the material. Softer brittle materials with MOHS hardness values in the range of 2-3 such as bismuth telluride formulations can be processed using a 3 hour time period. Harder materials such as Neodymium Iron Boride, and Ferrite materials require longer milling times. The process proceeds to Step 503 where the resultant material is then dried at 60 degrees centigrade, removed from the vessel and separated from the milling balls yielding a dried powder material. The process proceeds to Step 504 where the dried powder material is then sieved through a standard #400 mesh sieve. The powder material that has passed through the sieve in step 504 proceeds to Step 505 where this powder material is subjected to a second three to six hour long high-energy-ball-milling cycle depending on the material composition that reverses direction every thirty minutes as described in Step 502 using an Across International Planetary Ball Mill with fifty grams of the sieved material added to the 100 ml alumina vessel along with 15, 10 mm diameter and thirty, 6 mm diameter alumina balls and 10 ml of denatured alcohol to further reduce the maximum particle size. The process proceeds to Step 506 where the further reduced maximum particle size powder material yielded from Step 505 is then dried at 60 degrees centigrade, and then removed from the vessel, yielding a potential brittle functional material powder with a desired volumetric particle size distribution. For materials of low to moderate hardness, the milling process of Step 502 and Step 505 can be combined using a single milling cycle of the total duration and a single powder drying process. The process proceeds to Step 507 where a sample size of the potential brittle functional material powder is removed from the potential brittle functional material powder for analysis. The process proceeds to Step 510 where the sample size of the potential brittle functional material powder is submitted for particle size analysis. Volumetric particle size distribution and physical particle size analysis testing using a Malvern MasterSizer laser diffraction system forming the basis for this disclosure has demonstrated that a specific volumetric particle size distribution as shown in FIG. 4 is required for the successful supersonic cold-spray of fine features of brittle functional materials such as but not limited to crystalline, polycrystalline and glassy functional materials used in Electronic Materials, Optical Materials, Magnetic Materials and Energy Technology Materials applications. If the powder has a significant volumetric percentage of equivalent spherical particles greater than approximately 10 micrometers, then during the supersonic cold-spray process to create fine feature and or micro feature depositions, the larger crystalline particles will sandblast the surface instead of adhering. Powders with particle size distributions such as 403 can be used for large area micro-thin coatings and partial surface area micro-thin depositions, but the significant volumetric percentage of particles that are greater than 10 µm can prevent the formation of individual feature sizes below 30-40 µm, and will also prevent the deposition of fully dense material layers greater than approximately 60 µm in thickness. The details of this optimum particle size distribution forming the basis for this disclosure is not limited to but includes the measured distributions shown in FIG. 4. The process proceeds to Step 515 where a determination is made if the particles measured in Step 510 show that the volumetric particle size distribution is within the desired range. If the volumetric particle size distribution is not within the desired range, then the process proceeds to Step 560 where a determination is made if the physical particle sizes are too large. If the physical particle sizes are too large the process proceeds to Step 520 where an additional high energy milling cycle occurs. The duration and intensity of this additional high energy milling cycle is based on the brittle functional material type and sizing data measured in Step 510. Higher energy ball milling systems, or larger size ball milling vessels require adjustment to the total milling time of Step 502 and Step 505 to achieve the optimum particle size distribution. To develop the optimum particle size distribution for other types crystalline materials requires total milling time of Step 502 and Step 505 being adjusted to account for the material hardness and the crystalline structure, and may require an additional milling duration. Testing using bismuth telluride, antimony telluride and Neodymium Iron Boride has shown that the double ball milling process as described in Step 502 through Step 506 will produce a powder that can be successfully deposited into fine features using the supersonic cold-spray process. If the determination made in Step 560 that the physical particle sizes are not too large, the process proceeds to Step 590 and the potential brittle functional material powder is stored until it can be reprocessed for potential recovery and reuse. If it is determined in Step 515 that the volumetric particle size distribution is within the desired range, then the potential brittle functional material powder is identified as an acceptable powder for the cold-spray process and the process proceeds to Step 530 and the acceptable powder for the cold spray process is then stored in hermetically sealed containers for later use. Alternative methods for particle size reduction such as jet milling and other techniques can also be utilized.

The average particle size and the particle size distribution is one of the factors determining the minimum feature size that can be cold sprayed. The small particle size required for the cold spray deposition of brittle materials as shown in FIG. 4, however, suggest that feature sizes as small as the maximum particle size in the powder mix are possible using a masking process, and/or a surface micro-etching process.

Figure 8:
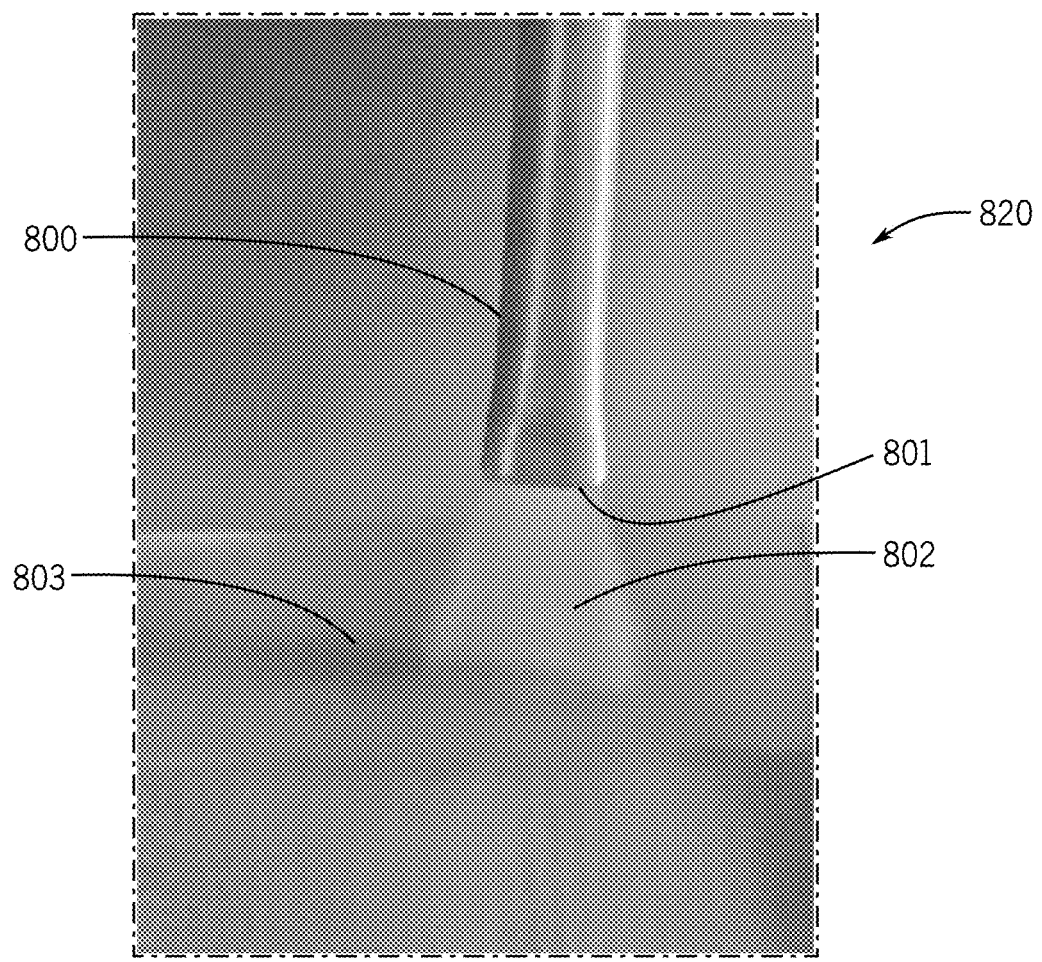
FIG. 8 is an image of a flared type nozzle extension which can be used for the narrow line cold spray deposition of brittle functional materials.
Figure 9:
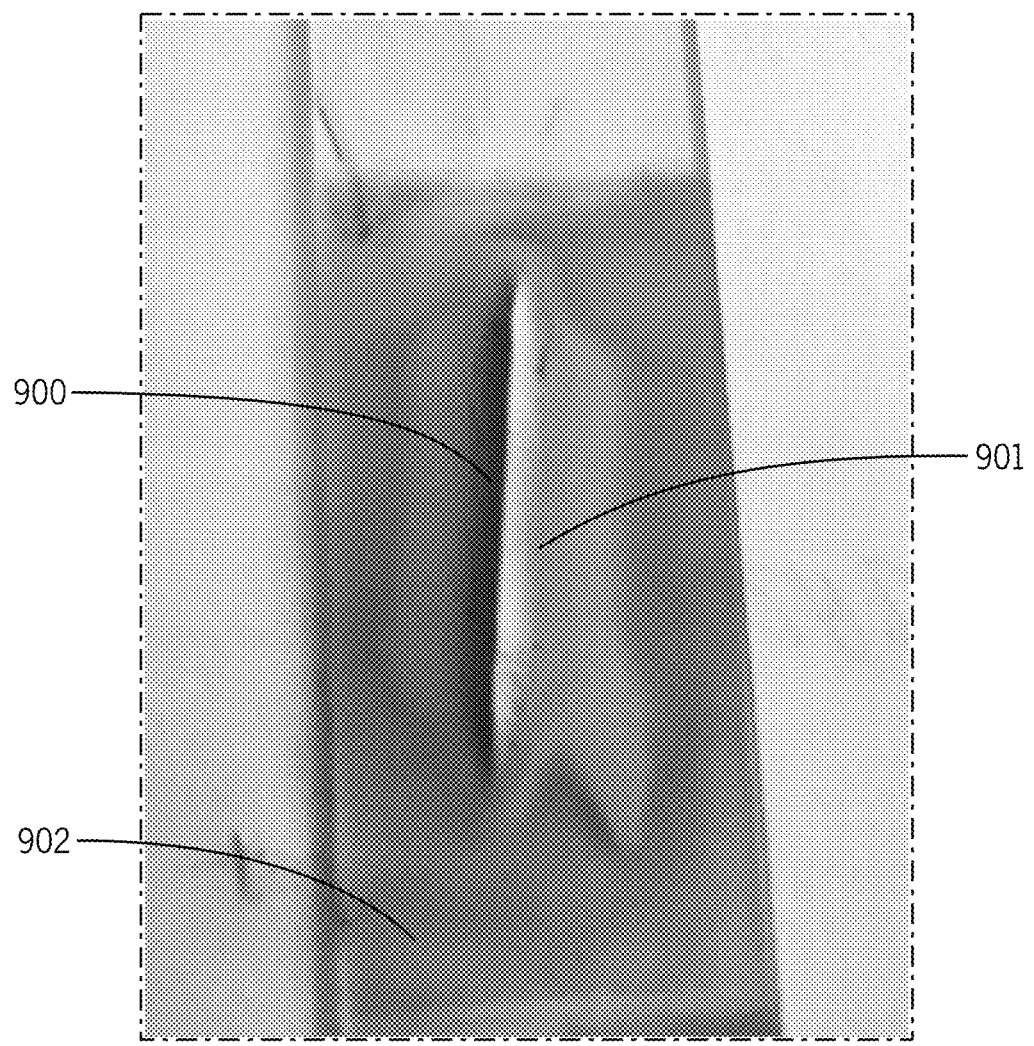
FIG. 9 is an image of a thin line deposition of a bismuth telluride thermoelectric semiconductor material demonstrating the ability to cold spray deposit more narrow features of brittle functional materials by shaping the exit point of the nozzle while at the same time maintaining the nozzle throat area to nozzle exit area ratio.

Supersonic cold Spray is generally thought of as a large feature deposition process with the primary determinant of the minimum feature size that can be deposited being essentially defined by the exit diameter of the nozzle used for the deposition. It is impractical to reduce the exit area of a supersonic cold spray nozzle used for brittle materials to less than 7-10 square mm without significant adverse effects on the powder feed mechanism, and to reduce the minimum width of the deposited brittle functional material to less than 2 mm as shown in FIG. 8 using a shaped nozzle configuration as shown in FIG. 9.

Many applications for functional brittle materials, particularly for semiconductors, magnetic materials, and some electronic materials, however, require features significantly smaller in minimum dimension than can be typically deposited using cold spray systems with nozzle exits in the 5-6 mm in diameter range. In addition, many commercial nozzle designs in current use for the cold spray deposition of metallic materials use a low taper angle for the divergent section of the nozzle assembly such that the design expansion area being used to achieve the maximum particle velocity occurs at the point the supersonic particles exit the nozzle. That taper results in a slightly broader circular shaped deposition area at the deposition surface due to the particles fanning out after they exit the nozzle.

Figure 6:
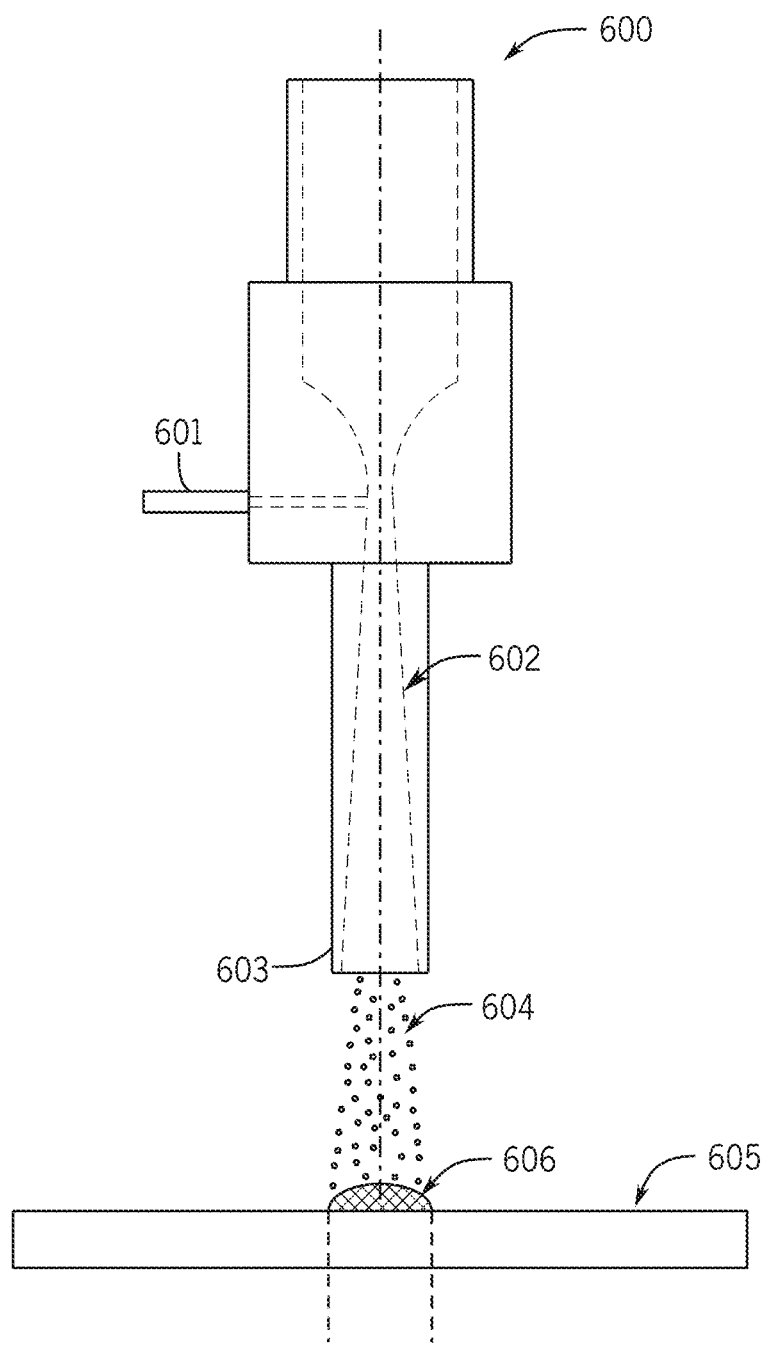
FIG. 6 is a diagram of one type of typical cold spray nozzle system which has been used for deposition of metallic materials.

FIG. 6 shows an example of a typical commercial cold spray nozzle for use in a low pressure cold spray system for the deposition of metallic materials. 600 is the de Laval type nozzle where the metal particles are injected and/or pulled by suction into the initial part of the diverging section of the nozzle 601. The diverging section is a low angle taper 602 where the gas and entrained particle stream then accelerates and expands. 603 represents the maximum diameter of the nozzle at its exit point. The particles in the gas stream then continue to fan out 604 until they impact the deposition surface 605 and form a deposit 606 with a deposition area slightly greater than the exit area of the nozzle 603. The deposition area is generally in the range of 25 to 35 square millimeters.

In the development of the cold spray process for brittle functional materials such as thermoelectric semiconductors it was determined that a modified nozzle design from that currently in use for metallic materials results in increased deposition and higher density of the deposited material when using the same powder with the cold spray system operating at the same gas temperature, gas pressure and gas type.

FIG. 7 is a cross section of the nozzle assembly which has been used for the successful deposition of micro thin layers and fine and micro features of bismuth telluride, antimony telluride and Tetrahedrite P-type and N-type thermoelectric semiconductors, Neodymium Iron Boride, Manganese Zinc Ferrite, Manganese ferrite, strontium ferrite, boron carbide and other crystalline type material powders. While this supersonic cold spray nozzle design has similarities to nozzles currently in use for the supersonic cold-spray deposition of metallic materials, as shown in FIG. 6, there are several unique differences which contribute to the ability to cold spray fine and micro features of a wide range of near theoretical density brittle functional materials as claimed in this disclosure. A cross section of a modified machined brass de Laval type convergent-divergent nozzle assembly 700 comprising a gas feeder section 730, a convergent-divergent section 740, a powder entry section 750, a brass inlet tube 708 and an exit section 780. The gas feeder section 730 comprising a first uniform area 701 having a top side 731 and an opposing side 732 being 11 millimeters in internal diameter and 4.1 centimeters in length and a first sharply tapered area 702. The first sharply tapered area 702 extends from the opposing side 732 of the first uniform area 701 and then being sharply tapered at an angle of 60 degrees from a center axis of the convergent-divergent nozzle assembly 700 to a 5 mm diameter where it transitions into a top side of the convergent portion 703 of the convergent-divergent section 740. The convergent-divergent section 740 comprising a convergent portion 703, a throat section, 704, and a divergent section 705. The convergent portion 703 consists of a top side 742, an opposing side 743. The top side 742 of the convergent portion 703 is immediately tapered at a total angle of 22 degrees for 9 mm to the opposing side 743 of the convergent portion 703. The opposing side 743 transitions to a top portion 746 of the throat section 704. The throat section 704 being 1.5 mm in diameter and extending to 3 mm in length to an opposing side 747 of the throat section 704 transitions to a top side 748 of the divergent section 705. The divergent section 705 is machined at a total cone angle of 12 degrees from the center axis for 18.3 mm in length to an opposing side 749 to achieve a throat area to exit area ratio of 10.

The powder entry section 750 comprising a powder entry hole 706 and the brass inlet tube 708. The powder entry hole 706 being 1.5 mm in diameter intersects the divergent section 705 of the nozzle at angle of 57 degrees 707 from the central axis and 14.3 mm from the opposing side 747 of the throat section 704. The brass inlet tube 708 being of an internal diameter of 1.5 mm and being of an external diameter of 3 mm. The powder feed system 5 of FIG. 1, attaches to the de Laval type convergent-divergent nozzle assembly 700 by inserting 713 a silicone rubber tube onto the brass inlet tube 708. The exit section 780 comprising a constant 5 mm internal diameter section being 1.4 cm in length 710, a stainless-steel extension tube 711, and an AN4 type compression fitting 712. The constant 5 mm internal diameter section being 1.4 cm in length 710 extends from the opposing side 749 of the divergent section 705 to a top side 785 of the stainless-steel extension tube 711. The stainless-steel extension tube 711 being of an ¼ inch external diameter and being of an internal diameter of 5 mm and being a nominal length of 10.5 cm. The AN4 type compression fitting 712 attaches and detaches the stainless-steel extension tube to the modified machined brass de Laval type convergent-divergent nozzle assembly 700.

Nitrogen, helium argon or other suitable gases at a nominal pressure of 0.7 MPa and temperature of 500 degrees centigrade enters the modified machined brass de Laval type convergent-divergent nozzle assembly 700 at the top side 731 of the first uniform area 701 of the gas feeder section 730. The brittle functional material particles fabricated as described in FIG. 5 are drawn into the powder entry section 750 from the silicone rubber tube 713 into the brass inlet tube 708 as suction is created at the powder entry hole 706. The moderate pressure, high temperature gas in the gas feeder section 730 rapidly expands and cools in the divergent section 705 of the convergent-divergent section 740 of the modified machined brass de Laval type convergent-divergent nozzle assembly 700. This gas flow creates suction at the powder entry hole 706 which pulls a 709 brittle functional material powder particles from the brass inlet tube—708 into the supersonic gas stream. The gas and rapidly accelerating entrained particles then continue through the exit section 780, first entering the constant 5 mm internal diameter section being 1.4 cm in length 710 and then enter the stainless-steel extension tube 711 prior to being deposited onto a substrate material as described in FIG. 6.

Aspects of this supersonic cold spray nozzle design which aid in the deposition of near theoretical density brittle functional materials with particle sizes in the 0.1-10 μm range as shown in FIG. 2, are the throat section being 1.5 mm in diameter, the convergence/divergence length ratio of 1 to 3, a nozzle expansion area ratio of 10, the divergent section total cone angle of 12 degrees from the center axis, the powder entry hole being 1.5 mm in diameter, intersecting the divergent section of the nozzle at an angle of 57 degrees from the central axis, and being 14.3 mm from the opposing side of the throat section.

FIG. 8 shows 820 an image of a flared type nozzle extension which can be used for the narrow line cold spray deposition of brittle functional materials. The majority of the 820 flared type nozzle extension is a straight uniform section 800 and a minority of the 820 flared type nozzle extension is an elongated shaped open exit section 801. The elongated shaped open exit section 801 having a total open exit area equal to an internal area of the straight uniform section 800 thus maintaining a desired nozzle expansion ratio. A plurality of 802 supersonic brittle functional material particles leave the elongated shaped open exit section 801 and deposit as a narrow line on a 803 deposition surface. This shaping of the elongated shaped open exit section 801 while maintaining the desired nozzle expansion ratio produces brittle functional material deposition features as narrow as 1.5 mm, and can also be used in conjunction with masking techniques to produce features as small as 10 microns in width.

FIG. 9 is an image showing 900 a 2 mm thin line deposition of a bismuth telluride thermoelectric semiconductor material demonstrating the ability to cold spray deposit more narrow features of brittle functional materials by shaping the exit point of the nozzle while at the same time maintaining the nozzle throat area to nozzle exit area ratio. Masking prior to cold spray or post deposition machining of a 902 deposition surface can be used to eliminate or remove the 901 overspray.

Figure 10:
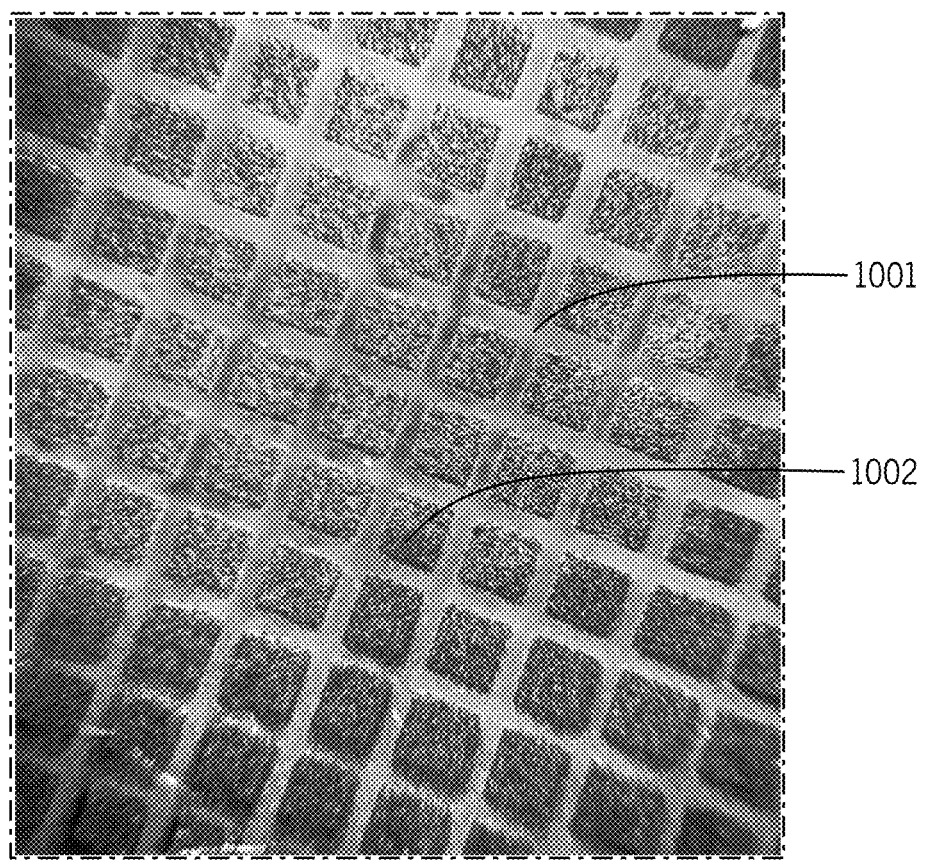
FIG. 10 is an image of a square pattern micro component made from a patterned brittle material deposition of Neodymium Iron Boride with 170 micron feature sizes formed using the equipment, powder particle size, and processes described in the current disclosure together with a metal screen type masking.

FIG. 10 is an image of a 1002 fine feature pattern of cold sprayed neodymium iron boride brittle functional material. Each square 1002 is a fine feature pattern (micro component) 170 microns on a side and approximately 20 microns in thickness. A simple screening was used to deposit a pattern yielding 1001 approximately 50 micron separation between the deposited features. Other patterns may be used to form other micro components with varying footprints, including polygonal, acuate, and/or linear shapes. Furthermore, in the depth direction the micro components may also take on more complex geometries by overlapping multiple deposition layers. The shape of respective layers in the depth direction of each micro component may be altered by applying a masking material to control the shape of the next deposition layer so as to build the micro component in the depth direction. Various masking materials are described in more detail with regard to FIGS. 15A-15E, and it should be understood that while particular, exemplary micro components are described herein as having been made with a particular mask (or set of masks), the embodiments described herein are not limited to any particular paring of example micro component with example mask material. Moreover, the exemplary micro components described herein may be formed via use of a wide variety of masking materials, as long as the masking material can take on a shape with an opening(s) that will permit cold-spray deposition of material on a substrate via the opening(s).

Uniform depositions can be made using screen openings down to 20 microns on a side, or other shapes by laser etching a thin metal mask.

Figure 11:
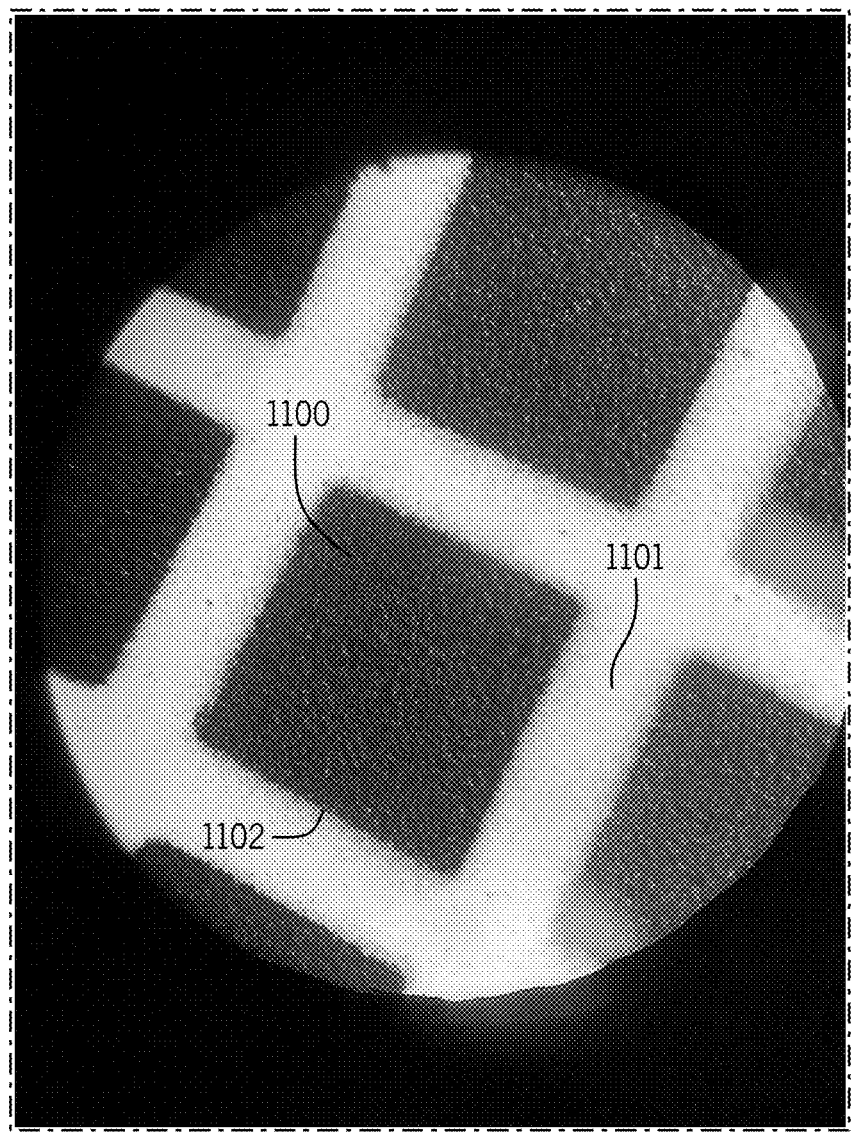
FIG. 11 is an image of an expanded micron sized micro component deposition of Neodymium Iron Boride magnetic material showing the clear edge definition of the feature which can be achieved using the processes and materials as defined in this disclosure.

FIG. 11 an image of an expanded detail of the fine feature brittle functional material cold spray deposits shown in FIG. 10. Reference 1100 is one of many 170 micron by 170 micron cold spray depositions of the neodymium iron boride brittle functional material being separated by 1101 a distance of 50 micron wide areas with no deposition, and having edges 1102 of the deposited area being very uniform and show variations in the order of the one half of the maximum particle size of the 402 powder shown in FIG. 4.

Figure 12:
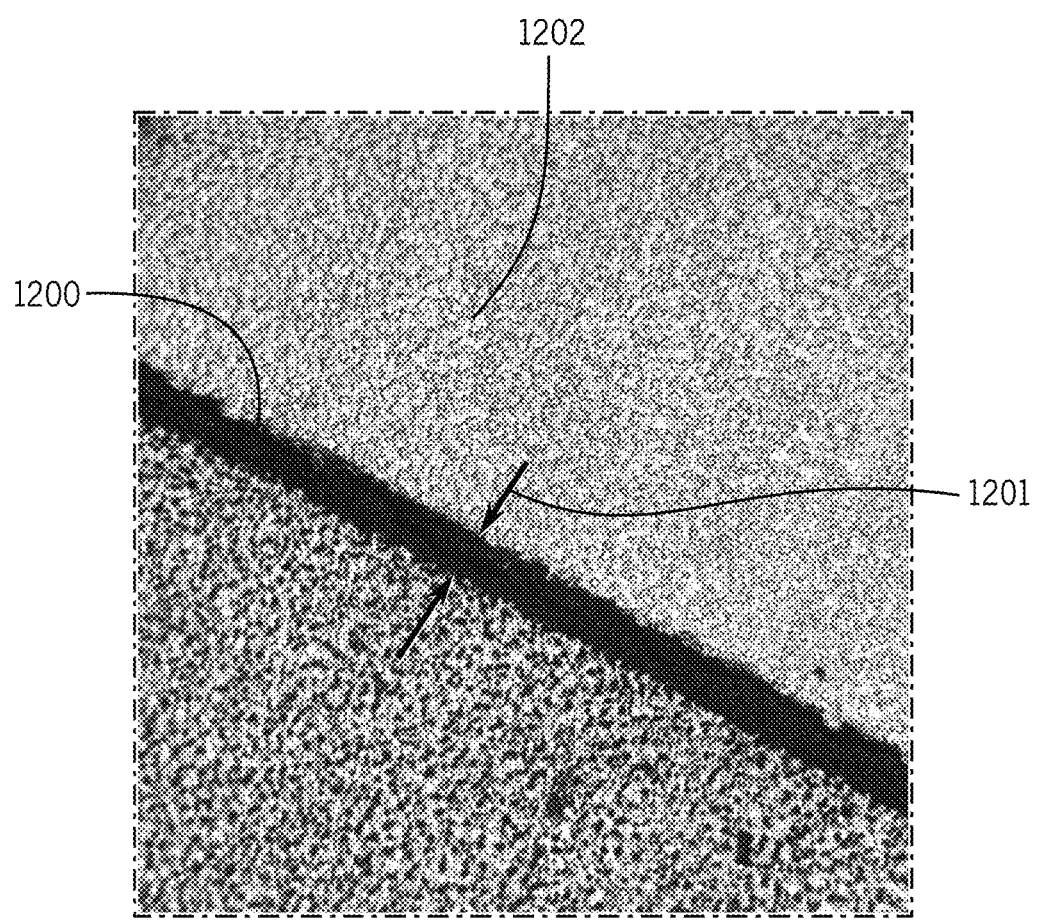
FIG. 12 is an image of a cold spray deposition of a line of magnetic material with a width of 20-25 micron using the particle sizes, equipment and processes described within this disclosure.

FIG. 12 is an image of a 1200 fine feature line cold spray deposition of a neodymium iron boride brittle functional material that is 1201 approximately 20 microns in width and deposited on 1202 an etched glass surface, where the material accumulates in a narrow line shaped opening in the mask (which has been removed. Very fine featured lines, and shapes of cold spray deposited brittle functional materials are possible using the processes defined in this disclosure. The 1200 fine feature line cold spray deposition of the magnetic material was made using a high temperature Kapton film masking method.

Figure 13:
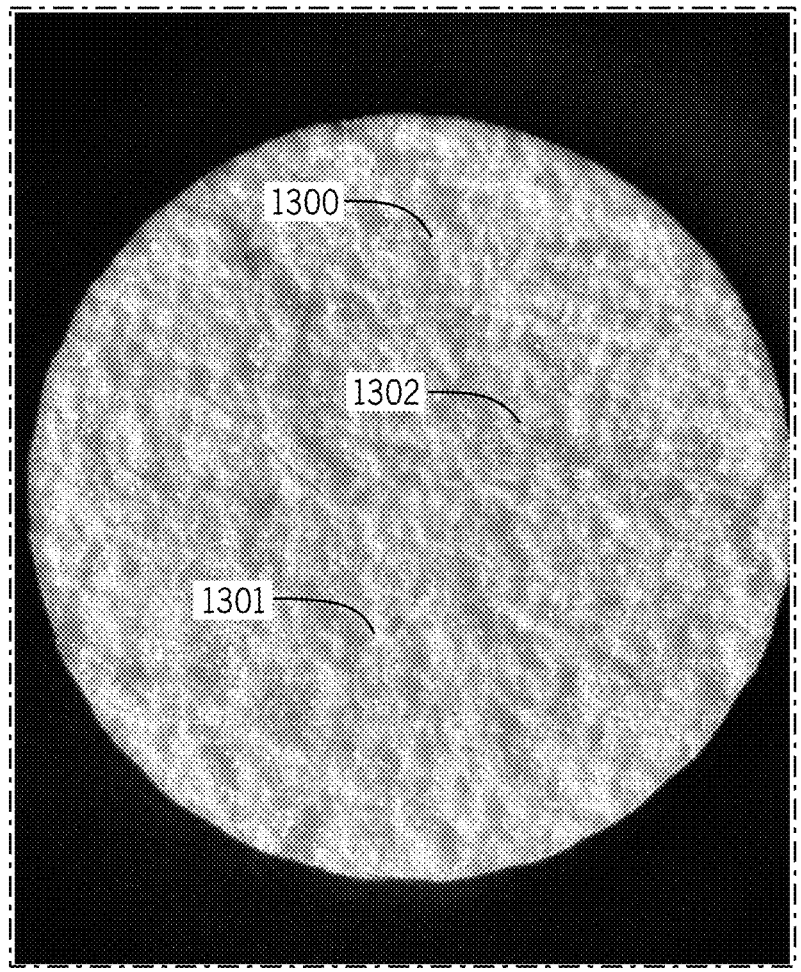
FIG. 13 is an image of a cold spray deposition of a low density, low thermal conductivity, low electrical conductivity borosilicate glass syntactic foam material that can be made using the materials and process as defined within this disclosure.

FIG. 13 is an image of a 1300 surface of a borosilicate glass low density, low thermal conductivity cold sprayed electrical insulator material that can be deposited using the process and materials as defined in this disclosure. 1301 is an image of a fused region of microspheres embedded in, microsphere fractured, and microspheres deformed that are knit together during the cold spray process. Fully intact 1302 microspheres can be seen on the material surface. The microspheres being those described in FIG. 3.

Figure 14:
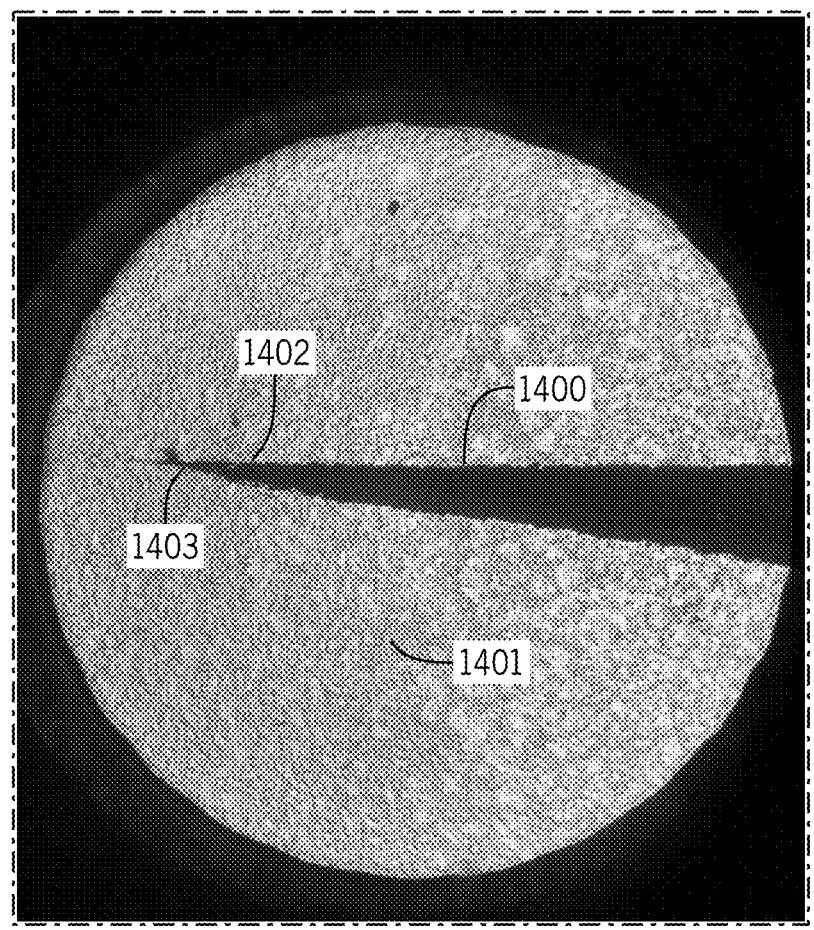
FIG. 14 shows an image of a fine and micro feature deposition of a bismuth telluride semiconductor prepared using a simple Kapton Film masking method.

FIG. 14 is an image of a fine feature deposition 1400 of a bismuth telluride semiconductor on a 1401 etched glass slide. The fine feature being a tapered cold spray deposition 1400 was made using powder of size distribution of an N-type bismuth telluride semiconductor material 1401 prepared using the process defined in this disclosure. The relatively low temperature of the cold spray process allows for simple masking methods. The etched glass slide 1401 was covered by a Kapton film with a simple mechanical removal of the area to be cold sprayed. Very sharp edged features 1402 can be made using this simple masking technique, with a minimum feature size 1403 as small as 10 μm.

Figure 15A:
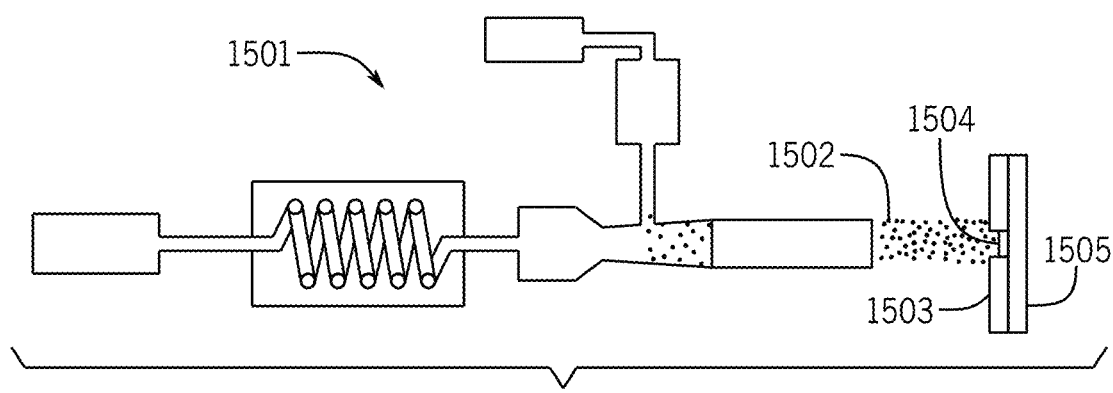
FIG. 15A is an example of an apparatus used for the cold spray deposition of brittle functional materials to form a micro component(s), where respective micro components are formed on the substrate in areas not covered by masking material.

FIG. 15A is an example of a cold spray deposition system 1501 of brittle functional material materials including a masking material 1503 to create micro component feature shapes as described within this disclosure. A series of micro component particles 1502 exit a nozzle are directed toward a 1505 substrate. The substrate 1505 being at least partially covered by a 1503 masking material with shaped openings 1504 that each correspond in shape with a two-dimensional layer of a micro component. Example shaped openings 1504 include but are not limited to linear shaped openings, square shaped openings, and tapered shaped openings in a size range with a minimum dimension from 10 μm to 2 mm.

Figure 15B:
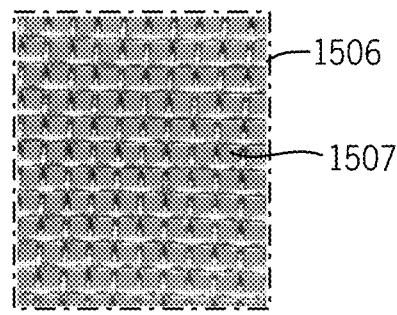
FIG. 15B is an image of an example of a metal screen mask used to create the microfeature cold spray depositions (array of micro components) shown in FIG. 10 and FIG. 11.

FIG. 15B is an image of a metal screen mask 1506 with individual rectangular shaped openings 1507 that was used to create the microfeature cold spray depositions shown in FIG. 10 and FIG. 11. Individual rectangular shaped screen openings 1507 from 20 μm to 2 mm or any combination thereof can be used.

Figure 15C:
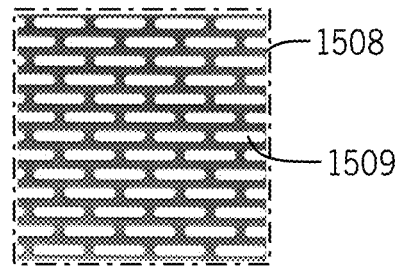
FIG. 15C is an image of an example of a perforated or etched metal plate mask which can be used to create single or multiple narrow line cold spray deposited features as shown in FIG. 12.

FIG. 15C is an image of an example of a 1508 perforated or etched metal plate mask that can be used to create single or multiple 1509 narrow line cold spray deposited features as shown in FIG. 12 with a minimum width of 10 µm.

Figure 15D:
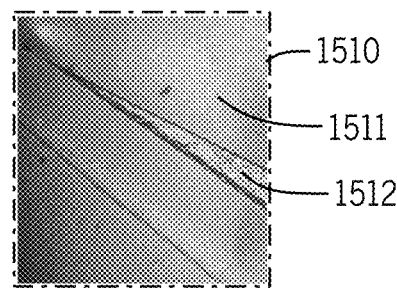
FIG. 15D is an image of an example of a Kapton polymer film mask wherein a tapered section of the Kapton polymer film was removed to expose a tapered section of the surface of a substrate to create a narrow microfeature cold spray depositions shown in FIG. 14.

FIG. 15D is an image of an example surface 1510 that has been masked with a high temperature capable Kapton polymer film 1511, which has been removed from the surface 1510 in such a way to expose in a tapered section 1512 of the surface 1510 having a point at the end of the taper as narrow as 10 µm to allow the cold spray deposition of brittle functional materials as shown in FIG. 14.

Figure 15E:
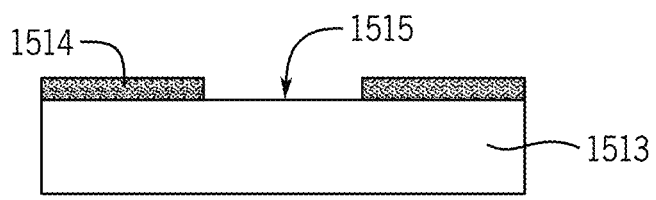
FIG. 15E is a diagram of a side view of a substrate having a photoresist material thereon used as a masking material to form one or more micro components.

FIG. 15E is a diagram of a side view of a substrate 1513 which has been coated with a photoresist material 1514. The photoresist material 1514 being exposed to a suitable radiation source, such as but not limited to ultraviolet light according to a pattern, so as to expose portions of a surface of the substrate 1513, where the micro component(s) will be formed. A portion of the photoresist material 1514 is then removed from the substrate 1513 in a predetermined shape area 1515 exposing an area of the substrate 1513 to enable the deposition of fine and microfeature cold spray deposition of brittle functional materials. into the 1515 predetermined shape area. Using this masking method, various shaped features can be created including but not limited to a linear shaped feature, a square shaped feature, and a complex shaped features. In addition, both positive photo resist techniques and negative photo resist techniques can be used as described in this disclosure.

While various masking materials have been described with respect to FIGS. 15B-15E, it should be understood that various other masking materials may be used as well. Furthermore, different layers of masking materials may be applied when forming a micro component that varies in shape in the height direction. For illustration purposes, a 4 sided pyramidal micro component may be made with a series of masks having progressively smaller square openings centered on top of a center of the initial layer of deposited material formed in a square shape. Moreover, each layer of the pyramidal micro component is formed by deposition of brittle particles in a square opening of a mask, followed by another layer deposited in an opening of a second mask layer with a smaller square opening than the first mask layer. These alternating steps of mask/deposition may be used to form a 3-dimensional multi-layer micro component with a profile that varies in width when viewed from the side.

The primary advantages of using the supersonic cold spray process for the deposition of fine and micro features of brittle functional materials is that the process can be tailored such that the desired functional material properties are maintained during the deposition process, and that simple masking processes can be used because of the low temperatures involved in the process. As an example, the gas temperature at the deposition surface for the tapered deposit shown in FIG. 14 is approximately 300° C. allowing the use of medium temperature polymer films such as but not limited to adhesive backed polyimide films which can be applied to the deposition surface and then mechanically cut or laser etched to form the desired deposition pattern. Other established masking techniques, such as but not limited to, photo, resists, etched metal plates, and metal and fiber screens can be used.

When cold spraying fine and micro-features of brittle functional materials, the spray pattern, even when using shaped nozzle extensions, is generally large compared to the desired feature size. Most of the functional material powder is therefore not deposited and can be lost in the process. Simple centrifugal particle separations systems can be used to recover most of the powder that is not deposited, and this material can be recycled and reprocessed for reuse.

A unique set of processes and equipment design considerations have been developed to enable the use of the supersonic cold-spray process in the deposition of fine and micro features from 2 mm down to 10 microns in minimum dimensions of brittle functional materials, such as but not limited to semiconductors, magnetic materials, graphite, and glasses. By judicious selection of the material particle size, the particle size distribution, and the cold spray system design and operating parameters, nanometer to very low micrometer size particles made from brittle functional materials can impact and wedge into a roughened surface and then mechanically interlock together to build up layers of brittle functional materials with a thickness less than or equal to the minimum dimension of the feature being deposited. As a result of the small average particle size required for the deposition of brittle functional materials, the minimum feature thickness and width can be 20 microns or less. The deposited material is near theoretical density and is without change to the material composition and structure thus preserving the materials desired functional properties. The particle size distribution, cold spray equipment design and applications processes as described in this disclosure are also applicable to the deposition of ductile materials, such as but not limited to aluminum.

The brittle functional materials cold-spray processes described in this disclosure can be used in numerous electronic material, magnetic materials, energy technology and environmental materials, as well as aerospace, smart materials, and optical materials applications. The developed powder preparation and sizing process, when combined with specific cold spray nozzle design parameters and the specific set of cold spray equipment operational parameters, allow the significant expansion of the use of supersonic cold spray technology to additively manufacture complex electronic and other devices which require the use of fine and/or micro features of brittle materials from multiple functional material classes. The fine or micro features deposited are composed solely of the brittle functional material and do not require the addition of ductile or binder materials in the functional material powder used in the cold spray process, thus the full functional properties of the material can be preserved. This ability to cold spray fine and micro features of multiple classes of functional materials will enable the potential expansion of the unique benefits of cold spray technology for the fabrication of both active and passive electronic devices.

The specific attributes of the cold spray process defined herein enables the additional potential for producing fine and micro feature deposits composed of multiple layers of different functional materials.

These processes which have been demonstrated for thermoelectric semiconductors, and both hard and soft magnetic materials also apply to the cold-spray deposition of all brittle functional material classes.

Aspects of the present disclosure include (1) A method of cold spray deposition of particles of brittle material to form a micro component, the method comprising:

feeding heated gas into a nozzle, the nozzle being a converging-diverging nozzle;

adding to the nozzle functional material powder comprising particles of brittle material having particle diameters in an inclusive range of 0.1 µm through 20 µm with a majority of the particles of brittle material having particle diameters in an inclusive range of 0.1

μm through 10 μm, the particles of brittle material having a functional property;

emitting a mixture of the heated gas and the functional material powder from the nozzle at a supersonic velocity toward a substrate; and coating at least a portion of a surface of the substrate with the particles of the brittle material emitted from the nozzle while maintaining the functional property of the particles of the brittle material, wherein the surface of the substrate includes a first portion and a second portion of the substrate, the second portion having a shape that corresponds with the micro component and having a minimum dimension in an inclusive range of 10 μm through 2 mm, and adhering the particles of brittle materials to one another in a layer on the second portion to form the micro component, the layer being one of a partial layer or a continuous layer.

(2) The method of (1), wherein the adhering includes adhering the particles of brittle materials to form the micro component in a square shape.

(3) The method of (1), wherein the adhering includes adhering the particles of brittle materials to form the micro component with a linear shape.

(4) The method of (1), further comprising applying at least another layer on the layer to increase a thickness of the micro component.

(5) The method of (1), further comprising:

applying masking material on the first portion of the surface of the substrate; and after the adhering, removing the masking material so the micro component remains as a separate discrete structure on the second portion of the surface of the substrate.

(6) The method of (5), wherein the masking includes applying as the masking material at least one of an adhesive backed polyimide film, a metal screen, an etched metal foil, a perforated metal foil, or a photo resist material.

(7) The method of (1), wherein the functional material powder includes irregular shaped particles with greater than 90 percent of the irregular shaped particles having a maximum dimension of 10 μm, and a minimum of 50 percent of the irregular shaped particles having a maximum dimension smaller than 5 μm.

(8) The method of (1) wherein the second portion of the surface of the substrate being a recess formed in the substrate and the micro component being formed in the recess.

(9) The method of (1), further comprising:

at least partially covering the surface of the substrate with at least one of irregularly shaped micro-spot deposits or fixed shape micro-spot deposits to form a spectrally selective surface, and wherein the adding includes adding the functional material powder into the nozzle at a predetermined rate.

(10) The method of (9), wherein at least 90% of the particles of brittle functional material consists of particles less than 1 μm in maximum dimension.

(11) The method of (1), wherein the particles of brittle material comprising a thermoelectric semiconductor material including at least one of an N-type thermoelectric semiconductor material, a P-type thermoelectric semiconductor material, or a combination of the N-type thermoelectric semiconductor material and the P-type thermoelectric semiconductor materials.

(12) The method of (11), wherein the thermoelectric semiconductor material includes a formulation including at least one of bismuth telluride, antimony telluride or tetrahedrite.

(13) The method of OA wherein the particles of brittle functional material comprising a magnetic material.

(14) The method of (13) wherein the magnetic material includes at least one of Neodymium Iron Boride or Strontium Ferrite.

(15) The method of (13) wherein the magnetic material includes a at least one of Manganese Zinc Ferrite, manganese ferrite, or nano-crystalline FeSi.

(16) The method of (1), wherein the particles of brittle material include a piezoelectric material.

(17) The method of (1) wherein the particles of brittle material include graphite.

(18) The method of (1), further comprising:

interconnecting the micro component with another micro component that is also formed on the second portion of the surface of the substrate via at least one of a pre-deposited or a post-deposited cold spray conductive material.

(19) The method of (1), wherein the at least a portion of the particles of brittle material comprising hollow glass microspheres having respective diameters in an inclusive range of 5 μm through 37 μm that, after the adhering, create fine features or layers of electrical and thermal isolation barriers between other particles of brittle material included in the adding.

(20) The method of (1), wherein the adding includes adding the functional material powder to the heated gas downstream of a throat of the nozzle, wherein the heated gas including at least one of nitrogen, helium, argon or a gaseous mixture that includes at least one of nitrogen, helium, and argon, and the feeding includes pressurizing the heated gas to a temperature in an inclusive range of 0.2 MPa through 1.7 MPa, and heating a gas to become the heated gas to a temperature in an inclusive range of 100 degrees centigrade through 650 degrees centigrade.

(21): The method of (1), wherein the adding includes adding the brittle functional material powder into the heated gas prior to a throat of the nozzle.

(22) The method of (4), further comprising:

successively repeating applying a layer of masking material on the substrate or the layer or the another layer; and after the applying a layer of masking material performing the coating, or another step of coating to alter a shape of the micro component in at least of a width or a depth.

(23) A product formed as a micro component by a cold spray deposition of particles of brittle material, the cold spray deposition of particles of brittle material comprising:

feeding heated gas into a nozzle, the nozzle being a converging-diverging nozzle;

adding to the nozzle a functional material powder comprising particles of brittle material having particle diameters in an inclusive range of 0.1 μm through 20 μm with a majority of the particles of brittle material having particle diameters in an inclusive range of 0.1

μm through 10 μm, the particles of brittle material having a functional property;

emitting a mixture of the heated gas and the functional material powder from the nozzle at a supersonic velocity toward a substrate; and coating at least a portion of a surface of the substrate with the particles of the brittle material emitted from the nozzle while maintaining the functional property of the particles of the brittle material, wherein the surface of the substrate includes a first portion and a second portion of the substrate, the second portion having a shape that corresponds with the micro component and having a minimum dimension in an inclusive range of 10 μm through 2 mm, and adhering the particles of brittle material to one another in a layer on the second portion to form the micro component, the layer being one of a partial layer or a continuous layer.

(24) The product of (23), wherein
the micro component has at least one of a linear shape, and a polygonal shape.

(25) The product of (23), wherein
the micro component has a multi-layered three dimensional structure, each layer corresponding to a separate deposition layer of the particles of brittle material.

(26) The product of (23), wherein
the particles of brittle material include irregular shaped particles with greater than 90 percent of the irregular shaped particles having a maximum dimension of 10 μm, and a minimum of 50 percent of the irregular shaped particles having a maximum dimension smaller than 5 μm.

(27) The product of (23), wherein
at least 90% of the brittle functional material consists of particles less than 1 μm in maximum dimension.

(28) The product of (23), wherein
the particles of brittle material comprising a thermoelectric semiconductor material including at least one of an N-type thermoelectric semiconductor material, a P-type thermoelectric semiconductor material, or a combination of the N-type thermoelectric semiconductor material and the P-type thermoelectric semiconductor materials.

(29) The product of (28) wherein
the thermoelectric semiconductor material includes a formulation including at least one of bismuth telluride, antimony telluride or tetrahedrite.

(30) The product of (28), wherein
the particles of brittle functional material comprising a magnetic material.

(31) The product of (30), wherein
the magnetic material includes at least one of Neodymium Iron Boride or Strontium Ferrite.

(32) The product of (30), wherein
the magnetic material includes a at least one of Manganese Zinc Ferrite, manganese ferrite, or nano-crystalline FeSi.

(33) The product of (23), wherein
the particles of brittle material include a piezoelectric material.

(34) The product of (23), wherein
the particles of brittle material include graphite.

(35) The product of (23), wherein
the micro component is interconnected with another micro component via a pre-deposited or a post-deposited cold spray conductive material.

(36) The product of (23), wherein
the at least a portion of the particles of brittle material comprising hollow glass microspheres having respective diameters in an inclusive range of 5 μm through 37 μm.

(37) A micro component comprising:
particles of brittle material having particle diameters in an inclusive range of 0.1 μm through 20 μm with a majority of the particles of brittle material having particle diameters in an inclusive range of 0.1 μm through 10 μm, the particles of brittle material having a functional property, wherein the particles of brittle material are arranged in a predetermined shape with a minimum dimension in an inclusive range of 10 μm through 2 mm, and the predetermined shape being a shape of the micro component.

(38) The micro component of (37), wherein
the particles of brittle material being bound to one another without an additional binding agent.

(39) The micro component of (37), wherein
the predetermined shape being a two dimensional shape when viewed from a plan view.

(40) The micro component of (39), wherein
the micro component being a multi-layered structure, each layer being a cold-spray deposited layer of the particles of brittle material, a thickness of the micro component corresponding with a number of deposited layers.

(41) The micro component of (40), wherein layers of the multi-layer structure being adhered to one another without an additional binding material.

(42) The micro component of (37), wherein the predetermined shape being a linear shape.

(43) The micro component of (37), wherein the predetermined shape being a polygonal shape.

(44) The micro component of (43), wherein the predetermined shape being a square.

(45) The micro component of (39), wherein the predetermined shape including a tapered feature.

(46) The micro component of (39), wherein the particles of brittle material comprising
irregular shaped particles with greater than 90 percent of the irregular shaped particles having a maximum dimension of 10 μm, and a minimum of 50 percent of the irregular shaped particles having a maximum dimension smaller than 5 μm.

(47) The micro component of (37), wherein at least 90% of the particles of brittle functional material consists of particles less than 1 μm in maximum dimension.

(48) The micro component of (37), wherein the particles of brittle material comprising a thermoelectric semiconductor material including at least one of an N-type thermoelectric semiconductor material, a P-type thermoelectric semiconductor material, or a combination of the N-type thermoelectric semiconductor material and the P-type thermoelectric semiconductor materials.

(49) The micro component of (48), wherein the thermoelectric semiconductor material includes a formulation including at least one of bismuth telluride, antimony telluride or tetrahedrite.

(50) The micro component of (37), wherein the particles of brittle functional material comprising a magnetic material.

(51) The micro component of (50), wherein the magnetic material includes at least one of Neodymium Iron Boride or Strontium Ferrite.

(52) The micro component of (51), wherein the magnetic material includes a at least one of Manganese Zinc Ferrite, manganese ferrite, or nano-crystalline FeSi.

(53). The micro component of (37), wherein the particles of brittle material include a piezoelectric material.

(54) The micro component of (37), wherein the particles of brittle material include graphite.

(55) The micro component of (37), further comprising a pre-deposited or a post-deposited cold spray conductive material that interconnects the micro component to another component.

(56) The micro component of (37), wherein the at least a portion of the particles of brittle material comprising hollow glass microspheres having respective diameters in an inclusive range of 5 µm through 37 µm.

Obviously, numerous modifications and variations of the present disclosure are possible in light of the above teachings. It is therefore to be understood that within the scope of the appended claims, the disclosure may be practiced otherwise than as specifically described herein.

The invention claimed is:

1. A method of cold spray deposition of a plurality of particles of brittle material to form a micro component, the method comprising:
   feeding heated gas into a nozzle, the nozzle being a converging-diverging nozzle;
   adding to the nozzle a functional material powder comprising the plurality of particles of brittle material having particle diameters in an inclusive range of 0.1 µm through 20 µm with a majority of the plurality of particles of brittle material having particle diameters in an inclusive range of 0.1 µm through 10 µm, the plurality of particles of brittle material having a functional property;
   emitting a mixture of the heated gas and the functional material powder from the nozzle at a supersonic velocity toward a substrate; and
   coating at least a portion of a surface of the substrate with the plurality of particles of brittle material emitted from the nozzle while maintaining the functional property of the plurality of particles of brittle material, wherein the surface of the substrate includes a first portion and a second portion of the substrate, the second portion having a shape that corresponds with the micro component and having a minimum dimension in an inclusive range of 10 µm through 2 mm, and
   adhering the plurality of particles of brittle materials to one another in a layer on the second portion to form the micro component, the layer being one of a partial layer or a continuous layer.

2. The method of claim 1, wherein
the adhering includes adhering the plurality of particles of brittle materials to form the micro component in a square shape.

3. The method of claim 1, wherein
the adhering includes adhering the plurality of particles of brittle materials to form the micro component in a linear shape.

4. The method of claim 1, further comprising applying at least another layer on the layer to increase a thickness of the micro component.

5. The method of claim 1, further comprising:
applying masking material on the first portion of the surface of the substrate; and
after the adhering, removing the masking material so the micro component remains as a separate discrete structure on the second portion of the surface of the substrate.

6. The method of claim 5, wherein the masking includes applying as the masking material at least one of
an adhesive backed polyimide film,
a metal screen,
an etched metal foil,
a perforated metal foil, or
a photo resist material.

7. The method of claim 1, wherein
the functional material powder includes irregular shaped particles with greater than 90 percent of the irregular shaped particles having a maximum dimension of 10 µm, and a minimum of 50 percent of the irregular shaped particles having a maximum dimension smaller than 5 µm.

8. The method of claim 1 wherein
the second portion of the surface of the substrate being a recess formed in the substrate and the micro component being formed in the recess.

9. The method of claim 1, further comprising:
at least partially covering the surface of the substrate with at least one of irregularly shaped micro-spot deposits or fixed shape micro-spot deposits to form a spectrally selective surface, and wherein
the adding includes adding the functional material powder into the nozzle at a predetermined rate.

10. The method of claim 9, wherein
at least 90% of the plurality of particles of brittle material consists of particles less than 1 µm in maximum dimension.

11. The method of claim 1, wherein
the plurality of particles of brittle material comprising a thermoelectric semiconductor material including at least one of an N-type thermoelectric semiconductor material, a P-type thermoelectric semiconductor material, or a combination of the N-type thermoelectric semiconductor material and the P-type thermoelectric semiconductor material.

12. The method of claim 11, wherein
the thermoelectric semiconductor material includes a formulation including at least one of bismuth telluride, antimony telluride or tetrahedrite.

13. The method of claim 1, wherein
the plurality of particles of brittle material comprising a magnetic material.

14. The method of claim 13 wherein
the magnetic material includes at least one of Neodymium Iron Boride or Strontium Ferrite.

15. The method of claim 13 wherein
the magnetic material includes at least one of Manganese Zinc Ferrite, manganese ferrite, or nano-crystalline FeSi.

16. The method of claim 1, wherein
the plurality of particles of brittle material include a piezoelectric material.

17. The method of claim 1 wherein
the plurality of particles of brittle material include graphite.

18. The method of claim 1, further comprising:
interconnecting the micro component with another micro component that is also formed on the second portion of the surface of the substrate via at least one of a pre-deposited or a post-deposited cold spray conductive material.

19. The method of claim 1, wherein at least a portion of the plurality of particles of brittle material comprising hollow glass microspheres having respective diameters in an inclusive range of 5 μm through 37 μm that, after the adhering, create fine features or layers of electrical and thermal isolation barriers between other of the plurality of particles of brittle material included in the adding.

20. The method of claim 1, wherein the adding includes adding the functional material powder to the heated gas downstream of a throat of the nozzle, wherein the heated gas including at least one of nitrogen, helium, argon or a gaseous mixture that includes at least one of nitrogen, helium, and argon, and the feeding includes pressurizing the heated gas to a temperature in an inclusive range of 0.2 MPa through 1.7 MPa, and heating a gas to become the heated gas to a temperature in an inclusive range of 100 degrees centigrade through 650 degrees centigrade.

21. The method of claim 1, wherein the adding includes adding the functional material powder into the heated gas prior to a throat of the nozzle.

22. The method of claim 4, further comprising:

applying a first layer of masking material on at least a portion of the at least another layer;

after the applying the first layer of masking material, performing another step of coating to form a first coating layer;

applying a second layer of masking material on at least a portion of the first layer of masking material or at least a portion of the first coating layer;

after the applying the second layer of masking material, performing an additional step of coating to form a second coating layer so as to alter a shape of the micro component in at least of a width or a depth.

* * * * *